US012763136B2

(12) United States Patent
Liaw

(10) Patent No.: US 12,763,136 B2
(45) Date of Patent: Oct. 13, 2026

(54) DUAL-PORT STATIC RANDOM ACCESS MEMORY

(71) Applicant: TAIWAN SEMICONDUCTOR MANUFACTURING COMPANY LTD., Hsinchu (TW)

(72) Inventor: Jhon Jhy Liaw, Hsinchu County (TW)

(73) Assignee: TAIWAN SEMICONDUCTOR MANUFACTURING COMPANY LTD., Hsin-Chu (TW)

( * ) Notice: Subject to any disclaimer, the term of this patent is extended or adjusted under 35 U.S.C. 154(b) by 457 days.

(21) Appl. No.: 18/152,782

(22) Filed: Jan. 11, 2023

(65) Prior Publication Data

US 2024/0087642 A1 Mar. 14, 2024

Related U.S. Application Data

(60) Provisional application No. 63/374,933, filed on Sep. 8, 2022.

(51) Int. Cl.

| | |
|---|---|
| ***G11C 11/419*** | (2006.01) |
| ***G11C 11/412*** | (2006.01) |
| ***H10W 20/41*** | (2026.01) |
| ***H10W 20/42*** | (2026.01) |

(52) U.S. Cl.
CPC .......... *G11C 11/419* (2013.01); *G11C 11/412* (2013.01); *H10W 20/42* (2026.01); *H10W 20/435* (2026.01)

(58) Field of Classification Search
CPC . G11C 11/419; G11C 11/412; H01L 23/5226; H01L 23/5283; H10W 20/42; H10W 20/435; H10D 89/10; H10B 10/12
USPC .................................................. 365/189.011
See application file for complete search history.

(56) References Cited

U.S. PATENT DOCUMENTS

| | | | | |
|---|---|---|---|---|
| 7,233,032 B2 | 6/2007 | Liaw | | |
| 8,144,540 B2 | 3/2012 | Liaw | | |
| 9,024,392 B2 | 5/2015 | Liaw | | |
| 9,640,540 B1 | 5/2017 | Liaw | | |
| 9,672,903 B2 | 6/2017 | Liaw | | |
| 9,892,781 B2 | 2/2018 | Liaw | | |
| 10,128,253 B2 * | 11/2018 | Liaw | G11C 8/16 | |
| 2009/0161410 A1 * | 6/2009 | Houston | G11C 11/412 | 365/189.14 |
| 2010/0259971 A1 * | 10/2010 | Liaw | G11C 8/16 | 29/592.1 |

* cited by examiner

*Primary Examiner* — Allison Bernstein
(74) *Attorney, Agent, or Firm* — Cooper Legal Group, LLC

(57) ABSTRACT

A memory device includes a first SRAM cell, a second SRAM cell, a write word line (WWL) landing line, and a Vdd line. The first SRAM cell and the second SRAM cell respectively include 8 transistors. The first WWL landing line is disposed inside a cell boundary of the first SRAM cell. The Vdd line is disposed in a cell boundary of the second SRAM cell. The first WWL landing line and the Vdd line are in a same layer.

20 Claims, 25 Drawing Sheets

DUAL-PORT STATIC RANDOM ACCESS MEMORY

PRIORITY CLAIM AND CROSS-REFERENCE

This application claims the benefit of prior-filed provisional application No. 63/374,933, filed on Sep. 8, 2022.

BACKGROUND

In deep sub-micron technology, static random access memory (SRAM) has become a very popular storage unit of high speed communication, image process and SOC products. Further, because dual-port SRAM allows parallel operation (in cycle includes 1 read (1R) and 1 write (1W), the dual-port SRAM has advantage of higher bandwidth in comparison with single-port SRAM. In order to meet the shrink requirements, the low loading, high speed purpose cell structure become very important factors in embedded memory and SOC products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
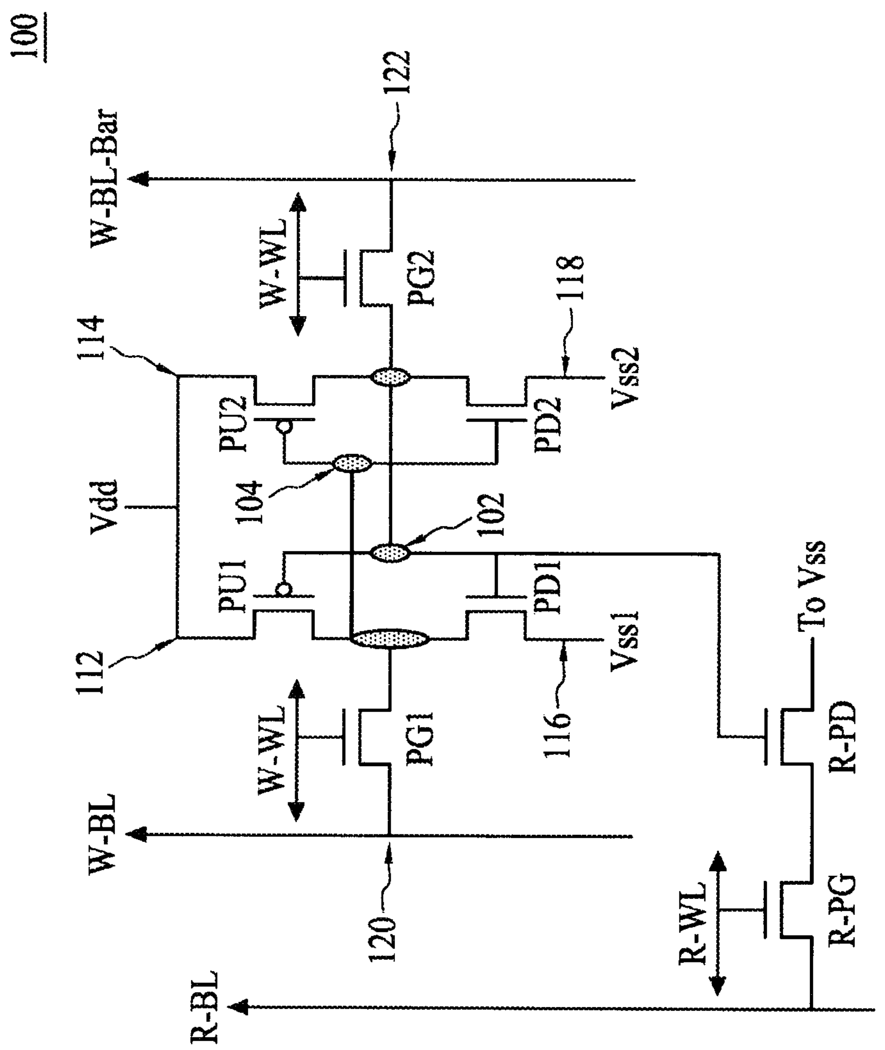
FIG. 1 shows a circuit diagram of a dual-port 8T-SRAM cell in accordance with aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

When entering into nanometer era, split-word-line SRAM cells have become increasingly popular due to their lithography-friendly layout shapes of active regions, polysilicon lines and metal layers, and also due to shorter bit-lines for speed improvement. However, in the nanometer era, SRAM cells area also larger, resulting in some issues. For example, each bit-line has to be connected to more rows of SRAM cells thereby inducing higher metal coupling capacitance, and reducing differential speed of the differential bit-lines (bit-line and bit-line bars).

In some comparative approaches, the bit-lines are disposed in a metallization layer of the lowest level in a back-end-of-line (BEOL) interconnect structure, such as a M1 layer, for reducing bit-line capacitance. In those approaches, the M1 layer pushes the metal pitch to limitation for logic circuit routing density. When a thickness of the M1 layer and a width of the bit-line are continuous shrunk, high resistance issues in both bit-line and Vss conductors (IR drop concern) arise. Further, cell speed and V_min performance are impacted. In some approaches, in order to reduce metal resistance for write bit-line and Vss conductors, widths of the write bit-line and Vss conductor are the made greater. Accordingly, the dual-SRAM structure suffers from issues such as complex BEOL metal routing.

According to one embodiment of the present disclosure, a memory device including two abutting dual-port 8T-SRAM cells is provided. The two SRAM cells can be periodically arranged to form a column-and-row array. Further, n+1 WWL landing lines and n+1 Vdd lines are provided for the 2n SRAM cells. Accordingly, capability for cell scaling down is improved and cell density is increased.

In some embodiments, in accordance with the ongoing down-scaling of integrated circuits, multi-gate semiconductor devices (i.e., multi-gate transistors) are used to form the SRAM cells. It should be noted that the present disclosure presents embodiments in the form of multi-gate transistors or fin-type multi-gate transistors referred to herein as FinFET devices. The FinFET devices may be GAA devices, nanosheet devices, Omega-gate (a-gate) devices, Pi-gate (H-gate) devices, dual-gate devices, tri-gate devices, bulk devices, silicon-on-insulator (SOI) devices, and/or other configurations. One of ordinary skill in the art may recognize other examples of semiconductor devices that may benefit from aspects of the present disclosure.

FIG. 1 shows a circuit diagram of a dual-port eight-transistor (8T) SRAM cell according to aspects of the present disclosure. The dual-port 8T SRAM cell 100 includes a read port (R) and a write port (W). The read port includes two pull-up transistors PU-1 and PU-2, two pull-down transistors PD-1 and PD-2, and two pass-gate transistors PG-1 and PG-2. The pull-up transistors PU-1 and PU-2 and the pull-down transistors PD-1 and PD-2 are p-type metal-oxide-semiconductor (PMOS) transistors, while the pass-gate transistors PG-1 and PG-2 are n-type metal-oxide-semiconductor (NMOS) transistors. The gates of pass-gate transistors PG-1 and PG-2 are controlled by a write word-line W-WL that determines whether the dual-port 8T-SRAM cell 100 is selected for writing into or not. A latch formed of the pull-up transistors PU-1 and PU-2 and the pull-down transistors PD-1 and PD-2 stores a bit, and complementary values of the bit are stored in storage data (SD) node 102 and SD node 104. The stored bit can be written into the dual-port 8T-SRAM cell 100 through complementary bit-lines including write bit-line W-BL and write bit-line-bar W-BLB.

Still referring to FIG. 1, the dual-port 8T-SRAM cell 100 is powered through a positive power supply node Vdd that has a positive power supply voltage (also denoted as VDD). The dual-port 8T-SRAM cell 100 is also connected to power supply voltage Vss (also denoted as VSS), which may be an electrical ground. The pull-up transistor PU-1 and the pull-down transistor PD-1 form a first inverter, and the pull-up transistor PU-2 and the pull-down transistor PD-2 form a second inverter. An input of the first inverter is connected to the pass-gate transistor PG-1 and an output of the second inverter. An output of the first inverter is connected to the pass-gate transistor PG-2 and an input of the second inverter.

A source of the pull-up transistor PU-1 is electrically connected to a Vdd node 112, and a source of the pull-up transistor PU-2 is electrically connected to a Vdd node 114, respectively. The Vdd node 112 and the Vdd node 114 are further electrically connected to the power supply node Vdd. A source of the pull-down transistor PD-1 is electrically connected to a Vss node 116, and a source of the pull-down transistor PD-2 is electrically connected to Vss node 118, respectively. The Vss node 116 is further electrically connected to the power supply voltage Vss1, and the Vss node 118 is further electrically connected to the power supply voltage Vss2. A gate of the pull-up transistor PU-1 and a gate of the pull-down transistor PD-1 are electrically connected to drains of the pull-up transistor PU-2 and the pull-down transistor PD-2, which form a connection node that is referred to as the SD node 102. A gate of the pull-up transistor PU-2 and a gate of the pull-down transistor PD-2 are electrically connected to the drains of the pull-up transistors PU-1 and the pull-down transistor PD-1, which connection node is referred to as the SD node 104. A source/drain of the pass-gate transistor PG-1 is electrically connected to the write W-BL at a BL node 120, and a source/drain of the pass-gate transistor PG-2 is electrically connected to a word-line W-BLB at a W-BLB node 122.

The dual-port 8T-SRAM cell 100 further includes a read port, which includes a read pull-down transistor R-PD and a read pass-gate transistor R-PG connected in series. A gate of the transistor R-PD is electrically connected to the SD node 102. A gate of the transistor R-PG is electrically connected to a read word-line (R-WL). A source/drain of the transistor R-PG is connected to read bit-line R-BL, which is connected to a local sensing circuit, and a source/drain of the transistor R-PD is connected to Vss.

Figure 2:
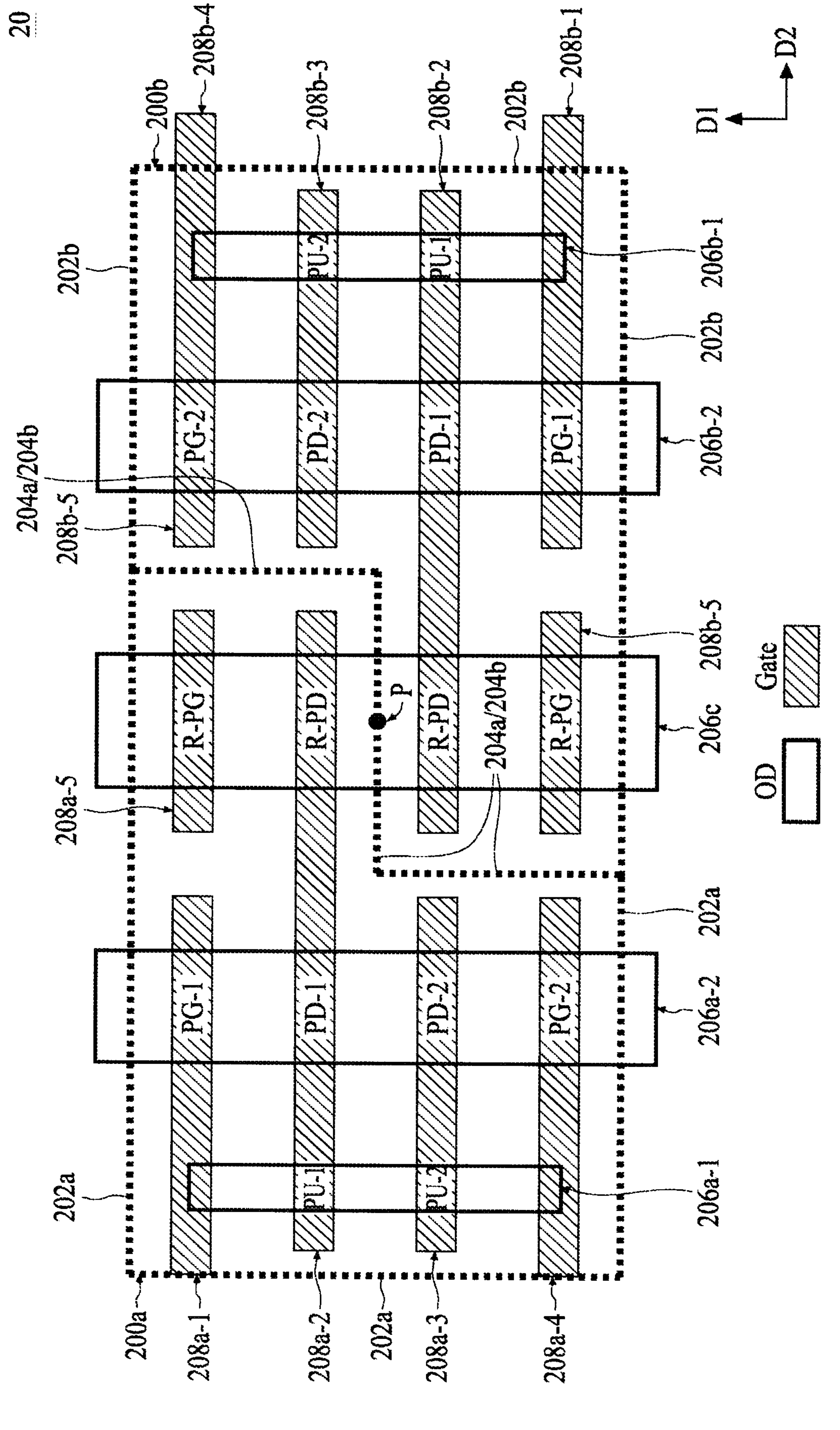
FIGS. 2 to 8 show layout structures of layers involved in a memory device according to aspects of the present disclosure.

FIG. 2 shows layout structures of a portion of a memory device 20 according to aspects of the present disclosure. In some embodiments, the memory device 20 includes two SRAM cells 200*a* and 200*b* as shown in FIG. 2. The SRAM cells 200*a* and 200*b* are disposed over a substrate (shown in FIGS. 20 to 25). The SRAM cell 200*a* may be defined by cell boundaries 202*a* and 204*a*, and the SRAM cell 200*b* may be defined by cell boundaries 202*b* and 204*b*. Further, the cell boundaries 204*a* and 204*b* overlap each other. The cell boundaries 202*a* are coupled to the cell boundaries 202*b* to define a pair of the SRAM cells 200*a* and 200*b*. In some embodiments, the cell boundaries 202*a* and 204*b* define a rectangular shape, but the disclosure is not limited thereto. Various active regions 206*a*-1, 206*a*-2, 206*b*-1, 206*b*-2 and 206*c* are defined in the substrate by isolations and are electrically isolated from each other by the isolations (shown in FIGS. 20 to 25).

In some embodiments, the active regions 206*a*-1, 206*a*-2, 206*b*-1, 206*b*-2 and 206*c* are fin active regions to form fin field-effect transistor (FinFET) devices. In such embodiments, each active region 206*a*-1, 206*a*-2, 206*b*-1, 206*b*-2 and 206*c* has one or more fin structures. Further, the fin structures extend in a direction D1 (shown in FIGS. 23 and 24). In some embodiments, the active regions are nano-wire or nano-sheet stack active regions to form gate-all-around (GAA) FET devices. In such embodiments, each active region 206*a*-1, 206*a*-2, 206*b*-1, 206*b*-2 and 206*c* has one or more nano-sheet stacks. Further, the nano-sheet stacks extend in the direction D1 (shown in FIGS. 20 and 21). The active regions 206*a*-1, 206*a*-2, 206*b*-1, 206*b*-2 and 206*c* may include N-type or P-type dopants depending on type of the FinFET devices and types of GAA FET devices. In some embodiments, the SRAM cell 200*a* includes the two active regions 206*a*-1 and 206*a*-2 disposed within the cell boundaries 202*a* and 204*a*, and the SRAM cell 200*b* includes the two active regions 206*b*-1 and 206*b*-2 disposed within the cell boundaries 202*b* and 204*b*. Further, the SRAM cells 200*a* and 200*b* share the active region 206*c*, as shown in FIG. 2. In some embodiments, a width of the active region 206*c* is greater than widths of the active regions 206*a*-2 and 206*b*-2, and the widths of the active regions 206*a*-2 and 206*b*-2 are greater than widths of the active regions 206*a*-1 and 206*b*-1. In some embodiments, the active regions 206*a*-1, 206*a*-2, 206*b*-1, 206*b*-2 and 206*c* are point symmetrical about a central point P in the active region 206*c*, but the disclosure is not limited.

Still refer to FIG. 2, the SRAM cell 200*a* includes a plurality of gates 208*a*-1 to 208*a*-5 disposed in the cell boundaries 202*a* and 204*a*, and extending in a direction D2. Similarly, the SRAM cell 200*b* includes a plurality of gates 208*b*-1 to 208*b*-5 disposed in the cell boundaries 202*b* and 204*b*, and extending in the direction D2. In contrast with the gates 208*a*-1 and 208*a*-4 of the SRAM cell 200*a*, the gates 208*b*-1 and 208*b*-4 of the SRAM cell 200*b* extend outside the cell boundary 202*b*. In other words, a portion of each of the gates 208*b*-1 and 208*b*-4 are disposed inside a cell boundary of another SRAM cell. In some embodiments, the direction D1 and the direction D2 are perpendicular to each other, but the disclosure is not limited thereto.

Each of the gates 208*a*-1 to 208*a*-5 and 208*b*-1 to 208*b*-5 includes a gate dielectric layer and a gate electrode disposed over the gate dielectric layer. In some embodiments, the gate dielectric layer may include silicon oxide, and the gate electrode may include polysilicon doped for N-type or P-type device. In other embodiments, the gate dielectric layer may include high-k dielectric material, and the gate electrode may include metal material. In some embodiments, all the gates 208*a*-1 to 208*a*-5 and 208*b*-1 to 208*b*-5 include a same width. In some embodiments, lengths of the gates 208*a*-2 and 208*b*-2 are equal, lengths of the gates 208*a*-3 and 208*b*-3 are equal, and lengths of the gates 208*a*-5 and 208*b*-5 are equal.

The gates 208*a*-1 to 208*a*-4 overlap the active regions 206*a*-1 and 206*a*-2, and the gates 208*a*-2 and 208*a*-5 overlap the active region 206*c*. In some embodiments, portions of the active regions exposed through two sides of the gates form source/drain. The source/drain may refer to a source or a drain, individually or collectively dependent upon the context. In some embodiments, the gate 280*a*-2 and the active region 206*a*-1 form a first pull-up transistor PU-1, and the gate 208*a*-3 and the active region 206*a*-1 form a second pull-up transistor PU-2. The gate 208*a*-1 and the active region 206*a*-2 form a first pass-gate transistor PG-1, the gate 208*a*-2 and the active region 206*a*-2 form a first pull-down transistor PD-1, the gate 208*a*-3 and the active region 206*a*-2 form a second pull-down transistor PD-2, and the gate 208*a*-4 and the active region 206*a*-2 form a second pass-gate transistor PG-2. The gate 208*a*-5 and the active region 206*c* form a read pass-gate transistor R-PG, and the gate 208*a*-2 and the active region 206*c* form a read pull-down transistor R-PD. Thus, a dual-port 8T-SRAM cell 200*a* is constructed.

The gate 208*b*-1 to 208*b*-4 overlap the active regions 206*b*-1 and 206*b*-2, and the gate 208*b*-2 and 208*b*-5 overlap the active region 206*c*. In some embodiments, the gate 280*b*-2 and the active region 206*b*-1 form a first pull-up transistor PU-1, and the gate 208*b*-3 and the active region 206*b*-1 form a second pull-up transistor PU-2. The gate 208*b*-1 and the active region 206*b*-2 form a first pass-gate transistor PG-1, the gate 208*b*-2 and the active region 206*b*-2 form a first pull-down transistor PD-1, the gate 208*b*-3 and the active region 206*b*-2 form a second pull-down transistor PD-2, and the gate 208*b*-4 and the active region 206*b*-2 form a second pass-gate transistor PG-2. The gate 208*b*-5 and the active region 206*c* form a read pass-gate transistor R-PG, and the gate 208*b*-2 and the active region 206*c* form a read pull-down transistor R-PD. Thus, a dual-port 8T-SRAM cell 200*b* is constructed.

In some embodiments, Further, the 8T-SRAM cell 200*a* and the 8T-SRAM cell 200*b* are abutting to have a rectangular configuration. In such embodiments, because the read pass-gate transistor R-PG and the read pull-down transistor R-PD of the SRAM cell 200*a*, and the read pass-gate transistor R-PG and the read pull-down transistor R-PD of the SRAM cell 200*b* share one active region 206*c*, dimensions of the SRAM cell 200*a* and the SRAM cell 200*b* are both reduced, thereby a density of the memory device can be increased.

The various active regions, the various gate structure and the various source/drain regions are formed by front-end-of-line (FEOL) manufacturing operations, and those details are omitted for brevity.

Figure 3:
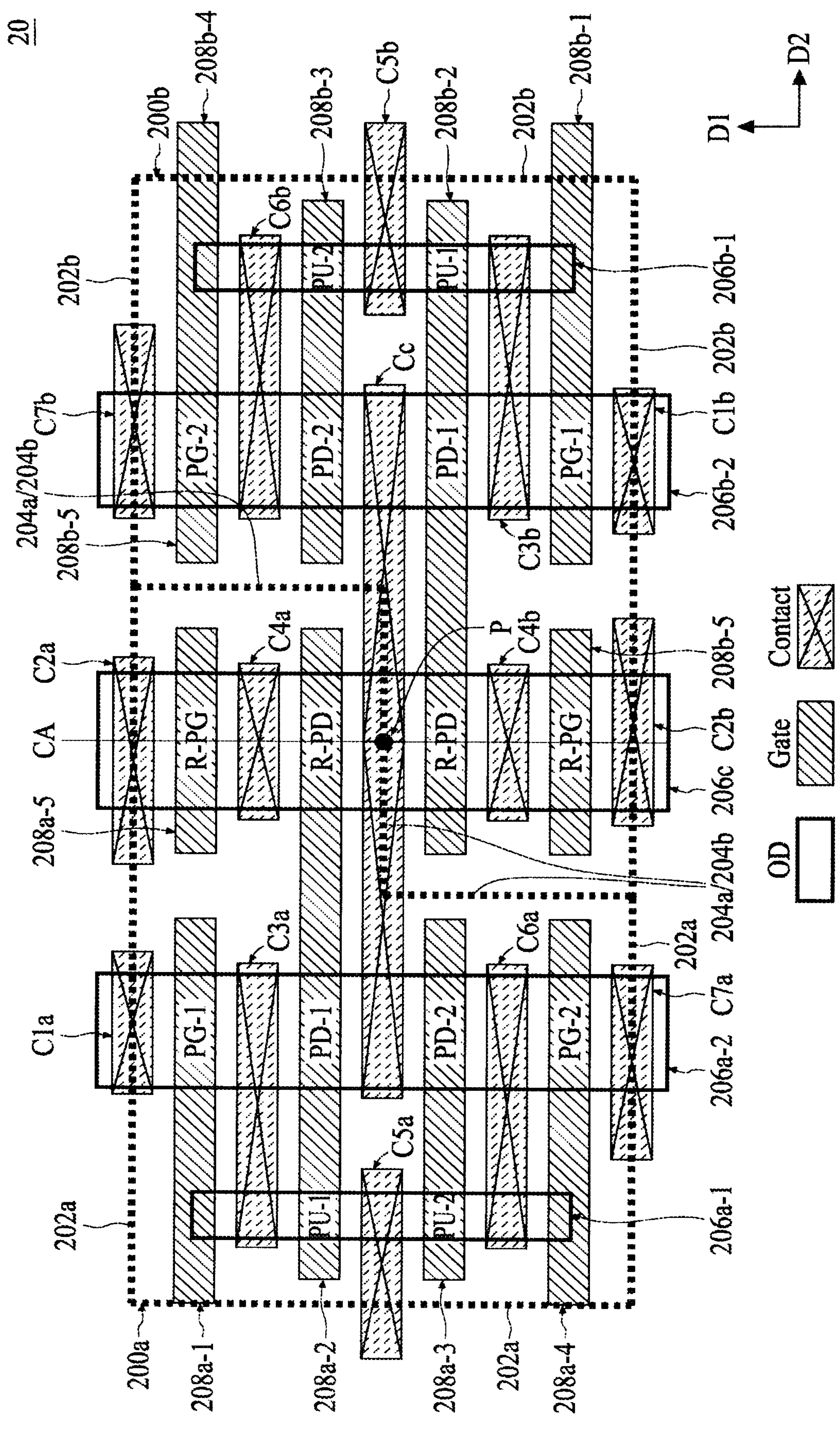

Referring to FIG. 3, the memory device 20 includes a plurality of contacts C1*a* to C7*a*, C1*b* to C7*b*, and Cc. The contacts C1*a* to C7*a*, C1*b* to C7*b*, and Cc may have a same width. Further, all the contacts C1*a* to C7*a*, C1*b* to C7*b*, and Cc extend in the direction D2.

In some embodiments, the contact C1*a* overlaps the active region 206*a*-2. Further, the contact C1*a* is coupled and electrically connected to the source of the first pass-gate transistor PG-1 of the SRAM cell 200*a*. The contact C1*b* overlaps the active region 206*b*-2. Further, the contact C1*b* is coupled and electrically connected to the source of the first pass-gate transistor PG-1 of the SRAM cell 200*b*. The contact C2*a* and the contact C2*b* overlap the active region 206*c*. Further, the contact C2*a* is coupled and electrically connected to the drain of the read pass-gate transistor R-PG of the SRAM cell 200*a*, while the contact C2*b* is coupled and electrically connected to the drain of the read pass-gate transistor R-PG of the SRAM cell 200*b*. The contact C3*a* overlaps the active regions 206*a*-1 and 206*a*-2, thereby electrically connecting the drain of the first pass-gate transistor PG-1 and the drain of the first pull-down transistor PD-1 to the drain of the first pull-up transistor PU-1 of the SRAM cell 200*a*. The contact C3*b* overlaps the active regions 206*b*-1 and 206*b*-2, thereby electrically connecting the drain of the first pass-gate transistor PG-1 and the drain of the first pull-down transistor PD-1 to the drain of the first pull-up transistor PU-1 of the SRAM cell 200*b*. The contact C4*a* and the contact C4*b* overlap the active region 206*c*. Further, the contact C4*a* is coupled and electrically connected to the source of the read pass-gate transistor R-PG (also referred to as the drain of the read pull-down transistor R-PD) of the SRAM cell 200*a*, while the contact C4*b* is coupled and electrically connected to the source of the read pass-gate transistor R-PG (also referred to as the drain of the read pull-down transistor R-PD) of the SRAM cell 200*b*. The contact C5*a* overlaps the active region 206*a*-1. Further, the contact C5*a* is coupled and electrically connected to the source of the first pull-up transistor PU-1 and the source of the second pull-up transistor PU-2 of the SRAM cell 200*a*. The contact C5*b* overlaps the active region 206*b*-1. Further, the contact C5*b* is coupled and electrically connected to the source of the first pull-up transistor PU-1 and the source of the second pull-up transistor PU-2 of the SRAM cell 200*b*. The contact C6*a* overlaps the active regions 206*a*-1 and 206*a*-2, thereby electrically connecting the drain of the second pull-down transistor PD-2 and the drain of the second pass-gate transistor PG-2 to the drain of the second pull-up transistor PU-2 of the SRAM cell 200*a*. The contact C6*b* overlaps the active regions 206*b*-1 and 206*b*-2, thereby electrically connecting the drain of the second pass-down transistor PD-2 and the drain of the second pass-gate transistor PG-2 to the drain of the second pull-up transistor PU-2 of the SRAM cell 200*b*. The contact C7*a* overlaps the active region 206*a*-2. Further, the contact C7*a* is coupled and electrically connected to the source of the second pass-gate transistor PG-2 of the SRAM cell 200*a*. The contact C7*b* overlaps the active region 206*b*-2. Further, the contact C7*b* is coupled and electrically connected to the source of the second pass-gate transistor PG-2 of the SRAM cell 200*b*.

The contact Cc overlaps the active regions 206*a*-2, 206*c* and 206*b*-2. Thus the contact Cc electrically connects the source of the first and second pull-down transistors PD-1 and PD-2 of the SRAM cell 200*a* to the source of the read pull-down transistor R-PD of the SRAM cell 200*a*, to the source of the read pull-down transistor R-PD of the SRAM cell 200*b*, and to the source of the first and second pull-down transistors PD-1 and PD-2 of the SRAM cell 200*b*.

Still referring to FIG. 3, in some embodiments, the contacts C1*a*, C2*a* and C7*b* are aligned with each other in the direction D2, the contacts C3*a*, C4*a* and C6*b* are aligned with each other in the direction D2, the contacts C5*a*, Cc and C5*b* are aligned with each other in the direction D2, the contacts C6*a*, C4*b* and C3*b* are aligned with each other in the direction D2, and the contacts C7*a*, C2*b* and C1*b* are aligned with each other in the direction D2. In some embodiments, the contacts C1*a* to C7*a*, C1*b* to C7*b*, and Cc may be arranged to have a point symmetry about the central point P.

The various contacts C1*a* to C7*a*, C1*b* to C7*b*, and Cc may be formed by middle-end-of-line (MEOL) manufacturing operations, and those details are omitted for brevity.

Figure 4:
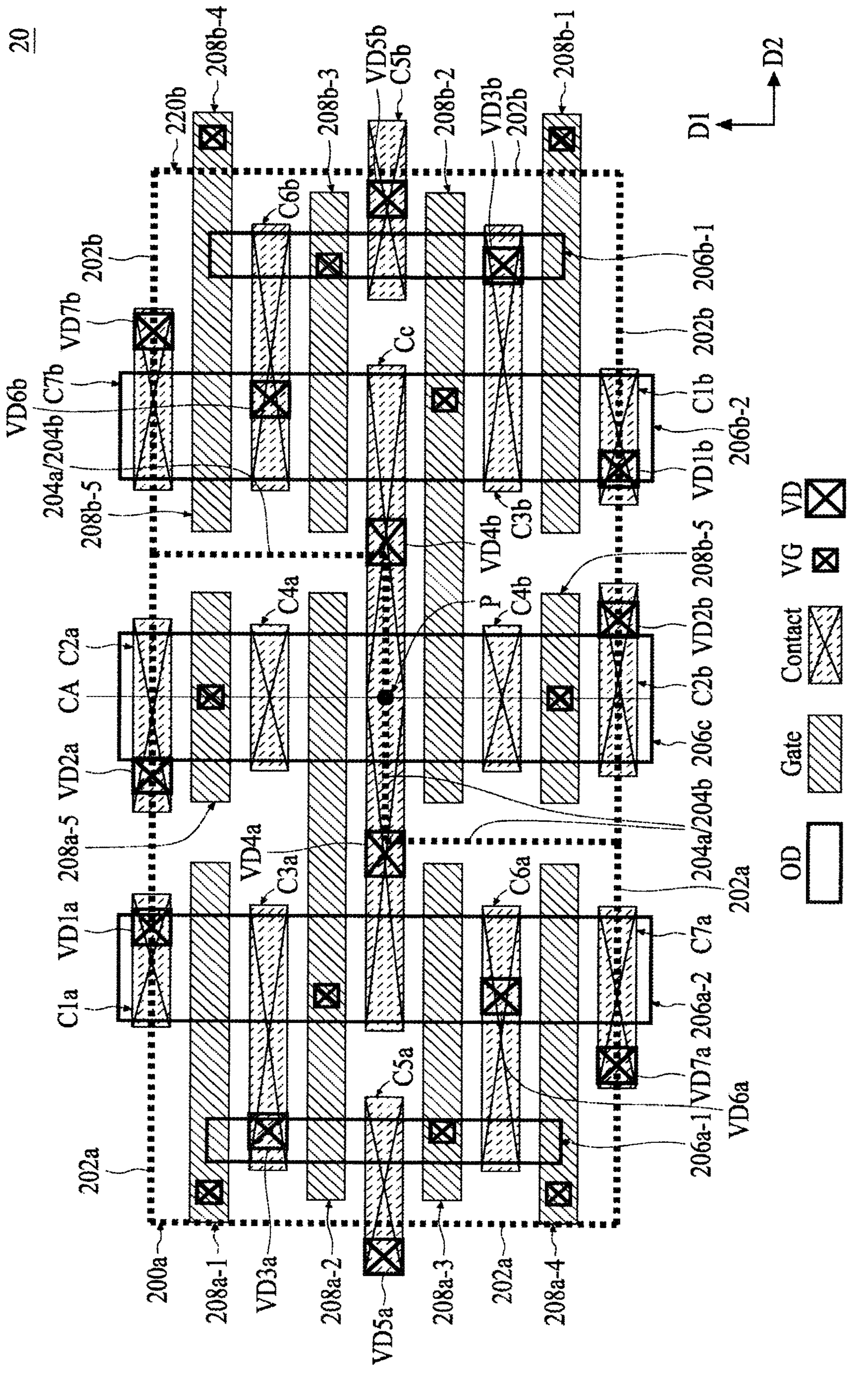

Referring to FIG. 4, in some embodiments, the memory device 20 includes a plurality of vias-to-gate VG. As shown in FIG. 4, each of the vias-to-gate VG overlaps one of the gates 208*a*-1 to 208*a*-5 and the gates 208*b*-1 to 208*b*-5. The vias-to-gate VG are coupled to and electrically connected to the gates 208*a*-1 to 208*a*-5 and to gates 208*b*-1 to 208*b*-5, respectively.

In some embodiments, the memory device 20 further includes a plurality of vias-to-drain VD (also referred to as vias-to-source/drain). The vias-to-drain VD are disposed over the contacts C1*a* to C7*a*, C1*b* to C7*b* and Cc. For example, the via-to-drain VD1 overlaps the contact C1*a*. Further, the via-to-drain VD1*a* is coupled and electrically connected to the contact C1*a*. The via-to-drain VD1*b* overlaps the contact C1*b*. Further, the via-to-drain VD1*b* is coupled and electrically connected to the contact C1*b*. In some embodiments, the via-to-drain VD2*a* partially overlaps the contact C2*a*, and the via-to-drain VD2*b* overlaps the contact C2*b*. Further, the via-to-drain VD2*a* is coupled and electrically connected to the contact C2*a*, and the via-to-drain VD2*b* is coupled and electrically connected to the contact C2*b*. The via-to-drain VD3*a* overlaps the contact C3*a*, and the via-to-drain VD3*b* overlaps the contact C3*b*. Further, the via-to-drain VD3*a* is coupled and electrically connected to the contact C3*a*, and the via-to-drain VD3*b* is coupled and electrically connected to the contact C3*b*. The vias-to-drain VD4*a* and VD4*b* overlap the contact Cc, and are coupled and electrically connected to the contact Cc. In some embodiments, the via-to-drain VD5*a* partially overlaps the contact C5*a*, and the via-to-drain VD5*b* overlaps the contact C5*b*. Further, the via-to-drain VD5*a* is coupled and electrically connected to the contact C5*a*, and the via-to-drain VD5*b* is coupled and electrically connected to the contact C5*b*. The via-to-drain VD6*a* overlaps the contact C6*a*, and the via-to-drain VD6*b* overlaps the contact C6*b*. Further, the via-to-drain VD6*a* is coupled and electrically connected to the contact C6*a*, and the via-to-drain VD6*b* is coupled and electrically connected to the contact C6*b*. The via-to-drain VD7*a* overlaps the contact C7*a*, and the via-to-drain VD7*b* overlaps the contact C7*b*. Further, the via-to-drain VD7*a* is coupled and electrically connected to the contact C7*a*, and the via-to-drain VD7*b* is coupled and electrically connected to the contact C7*b*.

In some embodiments, the vias-to-drain VD1*a*, VD2*a* and VD7*b* are aligned with each other in the direction D2, the vias-to-drain VD3*a* and VD6*b* are aligned with each other in the direction D2, the vias-to-drain VD5*a*, VD4*a*, VD4*b* and VD5*b* are aligned with each other in the direction D2, the vias-to-drain VD6*a* and VD3*b* are aligned with each other in the direction D2, and the vias-to-drain VD7*a*, VD2*b* and VD1*b* are aligned with each other in the direction D2. In some embodiments, the via-to-drain VD5*a* is disposed outside the boundary 202*a* of the SRAM cell 200*a*. In other words, the via to source/drain VD5*a* is entirely outside the 8T-SRAM cell 200*a*. In some embodiments, the via to source/drain VD5*a* is entirely outside boundaries 202*a* and 202*b* of the memory device 20.

Figure 5:
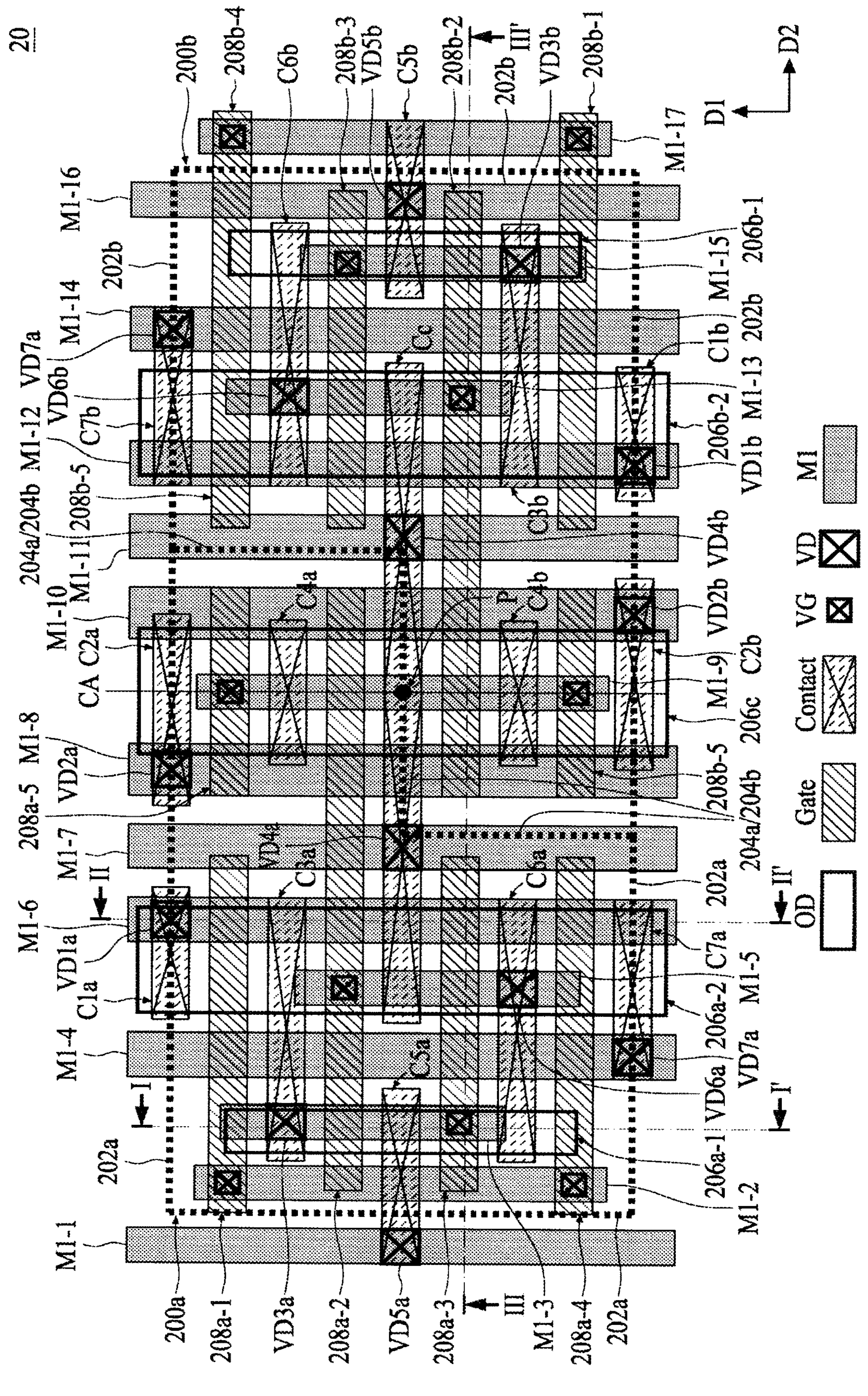

Referring to FIG. 5, the memory device 20 further includes a plurality of metallization layers M1 extending in the direction D1. In some embodiments, the metallization layers M1 may be a metallization layer of a back-end-of-line (BEOL) interconnect structure. Further, the metallization layers M1 may be the lowest metallization layer, which is the closest metallization layer to the substrate, of the BEOL interconnect structure. In some embodiments, widths of the metallization layers M1 are the same, but the disclosure is not limited thereto.

The metallization layers M1 are coupled and electrically connected to the vias. For example, a metallization layer M1-1 is electrically connected to the via-to-drain VD5*a*. The metallization layer M1-2 is electrically connected to the gates 208*a*-1 and 208*a*-4 through the vias-to-gate VG. The metallization layer M1-3 is electrically connected to the gate 208*a*-3 through the via-to-gate VG, and is also electrically connected to the via-to-drain VD3*a*. The metallization layer M1-4 is electrically connected to the via-to-drain VD7*a*. The metallization layer M1-5 is electrically connected to the gate 208*a*-2 through the via-to-gate VG, and is also electrically connected to the via-to-drain VD6*a*. The metallization layer M1-6 is electrically connected to the via-to-drain VD1*a*. The metallization layer M1-7 is electrically connected to the via-to-drain VD4*a*. The metallization layer M1-8 is electrically connected to the via-to-drain VD2*a*.

The metallization layer M1-9 is electrically connected to the gates 208*a*-5 and 208*b*-5 through the vias-to-gate VG.

The metallization layer M1-10 is electrically connected to the via-to-drain VD2*b*. The metallization layer M1-11 is electrically connected to the via-to-drain VD4*b*. The metallization layer M1-12 is electrically connected to the via-to-drain VD1*b*. The metallization layer M1-13 is electrically connected to the gate 208*b*-2 through the via-to-gate VG, and is also electrically connected to the via-to-drain VD6*b*. The metallization layer M1-14 is electrically connected to the via-to-drain VD7*b*. The metallization layer M1-15 is electrically connected to the gate 208*b*-3 through the via-to-gate VG, and is also electrically connected to the via-to-drain VD3*b*. The metallization layer M1-16 is electrically connected to the via-to-source/drain VD5*b*. The metallization layer M1-17 is electrically connected to the gates 208*b*-4 and 208*b*-1 through the vias-to-gate VG.

The metallization layer M1-1 serves as a Vdd line, the metallization layer M1-2 serves as a write word line (WWL) landing line, the metallization layer M1-4 serves as a bit line bar (BLB), the metallization layer M1-6 serves as a bit line (BL), the metallization layer M1-7 serves as a Vss line, and the metallization layer M1-8 serves as a read bit line (RBL), for the SRAM cell 200*a*. The metallization layer M1-9 serves as a read word line (RWL) landing line for the SRAM cells 200*a* and 200*b*. The metallization layer M1-10 serves as a RBL, the metallization layer M1-11 serves as Vss line, the metallization layer M1-12 serves as a BL, the metallization layer M1-14 serves as a BLB, the metallization layer M1-16 serves as a Vdd line, and the metallization layer M1-17 serves as a WWL landing line for the SRAM cell 200*b*.

Still referring to FIG. 5, it should be noted that in the boundaries 202*a* and 202*b* of the SRAM cells 200*a* and 200*b*, there are only one WWL landing line (i.e., the metallization layer M1-2) and only one Vdd line (i.e., the metallization layer M1-16). Additionally, the Vdd line (i.e., the metallization layer M1-1) is outside the boundaries 202*a* and 202*b* of the SRAM cells 200*a* and 200*b* and disposed in cell boundaries of another SRAM cell. The WWL landing line (i.e., the metallization layer M1-17) is outside the boundaries 202*a* and 202*b* of the SRAM cells 200*a* and 200*b* and disposed in cell boundaries of still another 8T-SRAM cell.

Figure 6:
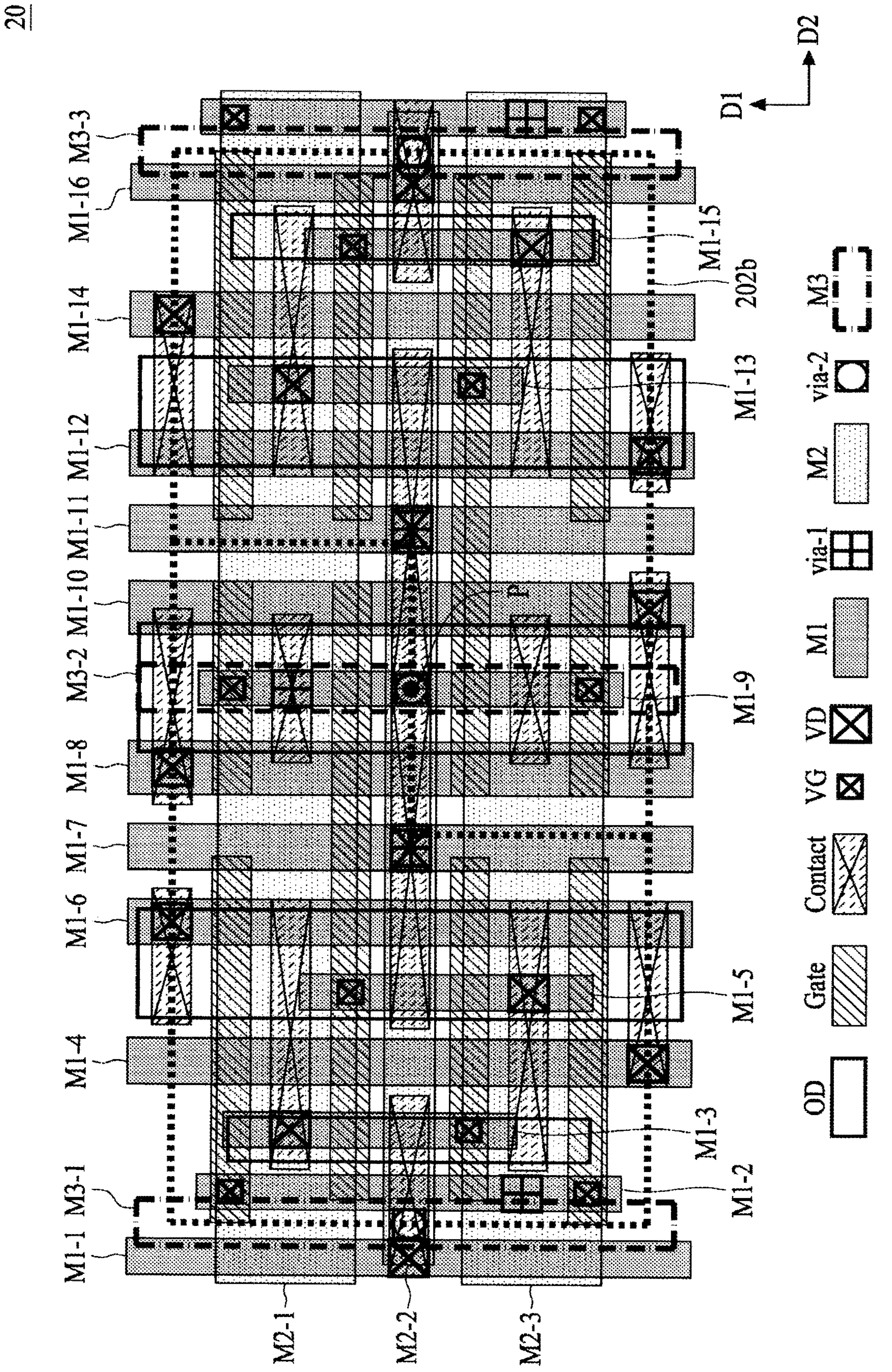
Figure 7:
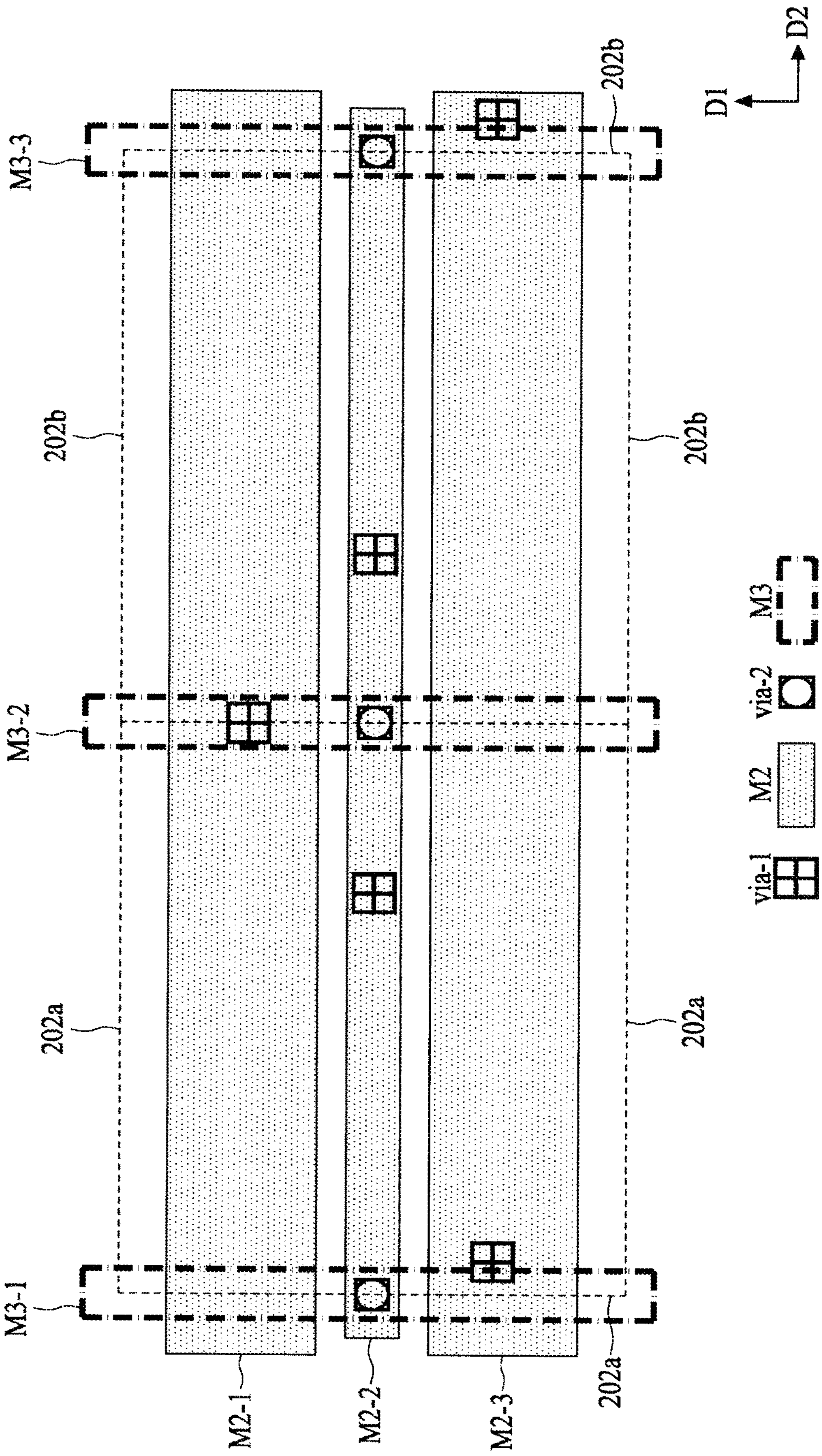

Please refer to FIGS. 6 and 7, wherein FIG. 6 shows layout structures including further metallization layers involved in the SRAM cells 200*a* and 200*b*, and FIG. 7 shows the metallization layers overlying the SRAM cells 200*a* and 200*b*. For clearance, the detail of the SRAM cells 200*a* and 200*b* are omitted from FIG. 7. As shown in FIGS. 6 and 7, a plurality of metallization layers M2 are disposed over the metallization layers M1. The metallization layers M2 may be electrically connected to underlying layers through vias-1. For example, the metallization layer M2-1 is electrically connected to the metallization layer M1-9 through the via-1. The metallization layer M2-2 is electrically connected to the metallization layers M1-7 and M1-11 through the vias-1. The metallization layer M2-3 is electrically connected to the metallization layers M1-2 and M1-17 through the vias-1. A plurality of metallization layers M3 are disposed over the metallization layers M2, and are electrically connected to the underlying layers through the vias-2. For example, the metallization layers M3-1 to M3-3 are electrically connected to the metallization layer M2-2 through the vias-2.

The metallization layers M2 extend in direction D2, and the metallization layers M3 extend in the direction D1. In some embodiments, the metallization layer M2-1 serves as a read word line (RWL), the metallization layer M2-2 serves as a Vss line, and the metallization layer M2-3 serves as a write word line (WWL). In some embodiments, the metallization layers M3-1 to M3-3 serves as Vss lines.

In some embodiments, the W_WL, the W_BL and W_BLB are the write-port, and the R_WL and R_BL are the read-port. Accordingly, dual-port 8T-SRAM cells 200*a* and 200*b* are obtained.

In some embodiments, the metallization layers M1, the vias VD and VG, the metallization layers M2, the vias-1, the metallization layers M3 and the vias-2 are formed by BEOL manufacturing operations, and those details are omitted for brevity.

Figure 8:
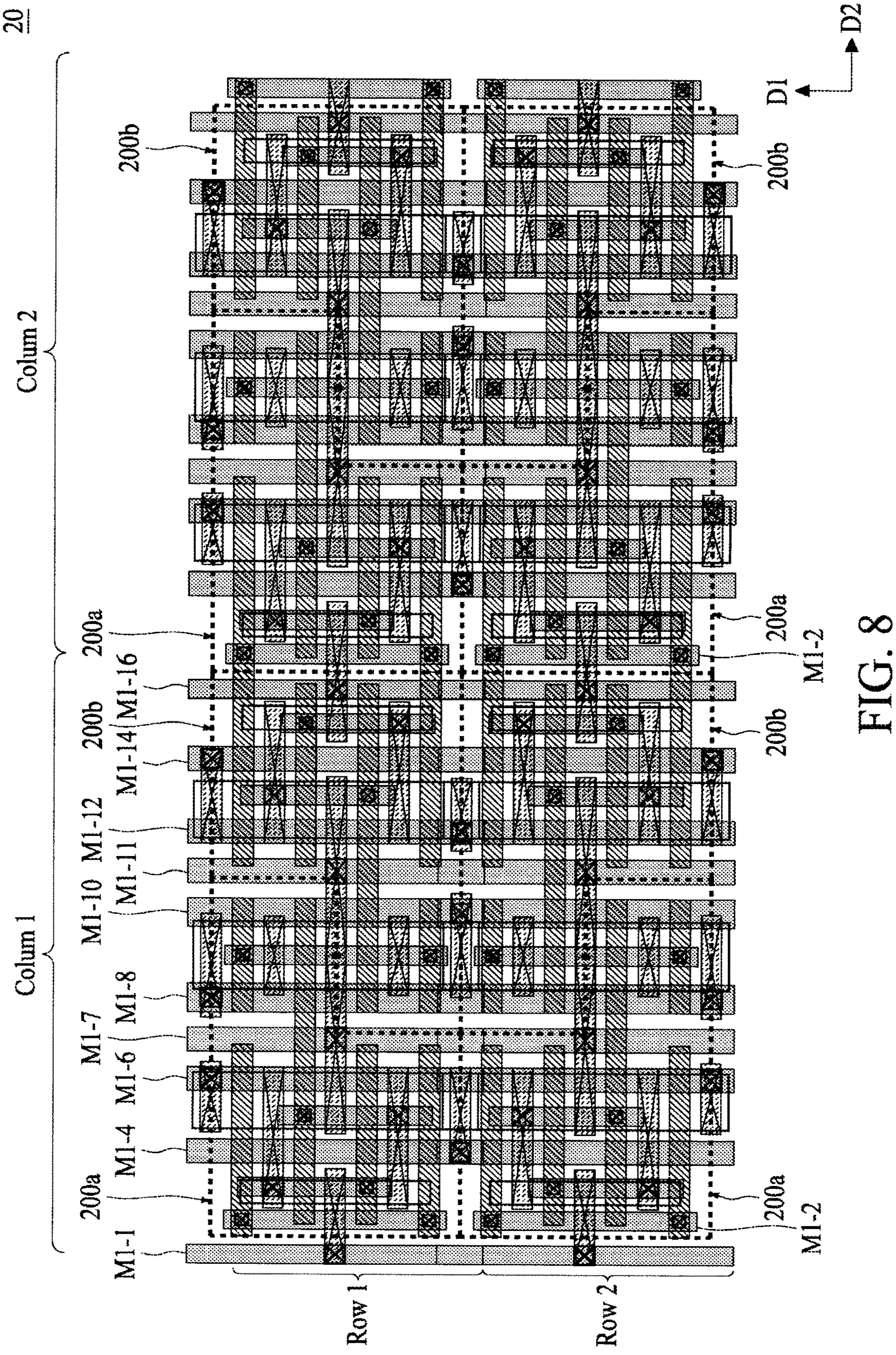

Referring to FIG. 8, in some embodiments, the SRAM cells 200*a* and 200*b* of the memory device 20 can be periodically arranged to form a column-and-row array. In some embodiments, the arrangement of the cells 200*a* and 200*b* in adjacent columns (i.e., the Column 1 and the Column 2) in the same row (i.e., the Row 1 or the Row 2) are the same. However, the SRAM cells 200*a* and 200*b* in the same column (i.e., the Column 1 or the Column 2) in the adjacent rows (i.e., the Row 1 and the Row 3) are line symmetrically arranged.

As shown in FIG. 8, the Vdd lines (the metallization layers M1-1 and M1-16) provide voltages to the cells 200*a* in each row and in the same column. The Vdd line (the metallization layer M1-16) provides a voltage to the cells 200*a* in each row and in adjacent columns. In such embodiments, the metallization layer M1-16 in Column 1 is referred to the metallization layer M1-1 in Column 2, and the metallization layer M1-16 in Column 1 further provides voltages to the cells 200*b* in each row and in adjacent columns. In other words, the metallization layer M1-16 in Column n is referred to the metallization layer M1-1 in Column n+1. In such embodiments, n columns including 2n SRAM cells 200*a* and 200*b* require n+1 Vdd lines, instead of 2*n* Vdd lines. N is a positive integer.

Still referring to FIG. 8, the WWL landing line (the metallization layer M1-2) in each cell 200*a* provides voltages to the gates of the first and second pass-gate transistors PG-1 and PG-2 of the SRAM cells 200*a* in Column 1. Starting from Column 2, the WWL landing line (the metallization layer M1-2) in each cell 200*a* provides voltages to the gates of the first and second pass-gate transistors PG-1 and PG-2 of the SRAM cells 200*b* in Column 1, and to the gates of the first and second pass-gate transistors PG-1 and PG-2 of the SRAM cells 200*a* in Column 2. In such embodiments, m cells 200*a* and 200*b* require m WWL landing lines. M is a positive integer two times n.

Figure 9:
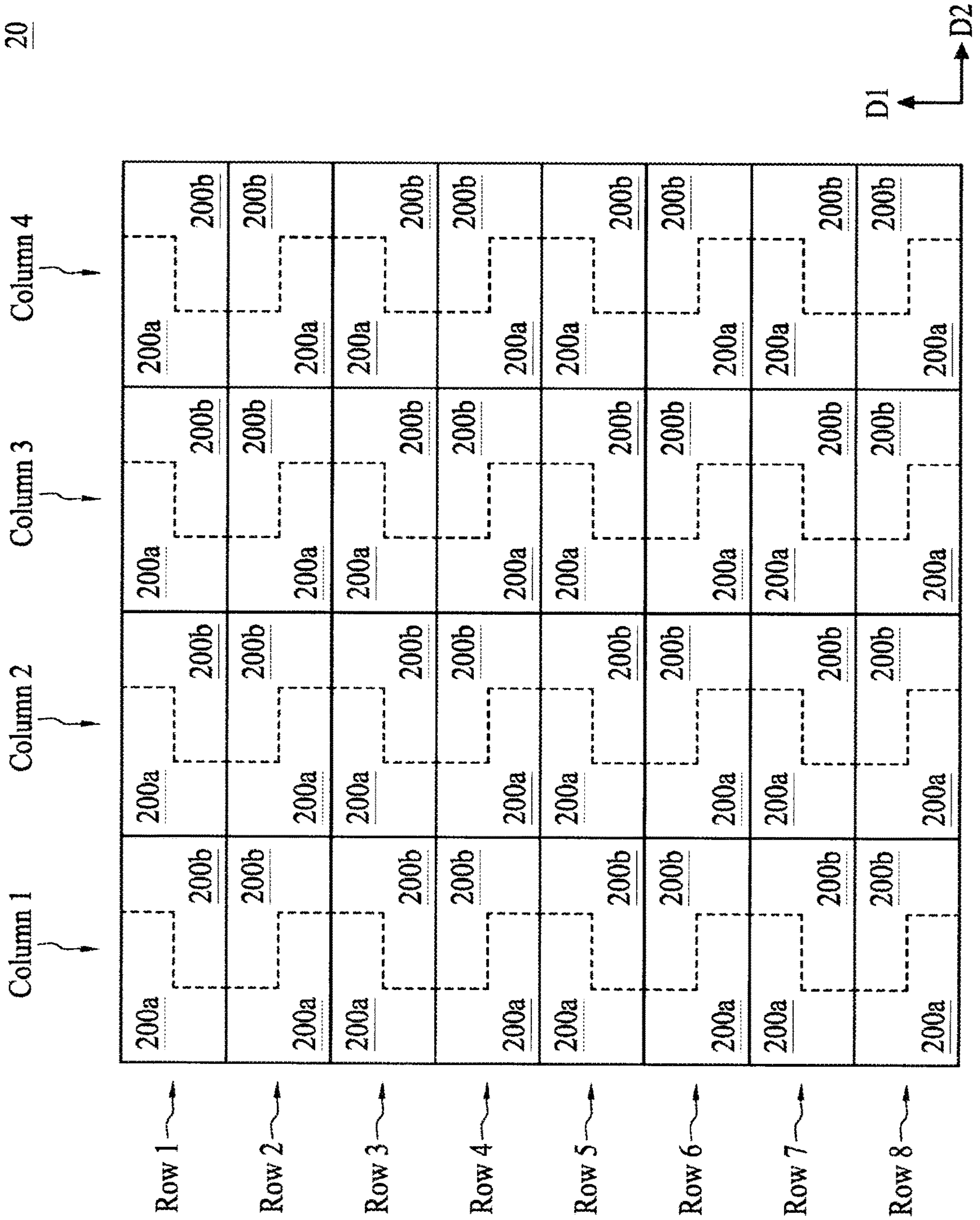
FIG. 9 is a schematic drawing illustrating the memory device of FIG. 8.

Referring to FIG. 9, more SRAM cells 200*a* and 200*b* are illustrated. According to the memory device 20 provided by some embodiments, the arrangements of the SRAM cells 200*a* and 200*b* in each column are the same. The arrangements of the SRAM cells 200*a* and 200*b* in odd rows are the same, and the arrangements of the SRAM cells 200*a* and 200*b* in even rows are the same. The arrangements of the SRAM cells 200*a* and 200*b* in the odd rows is line symmetrical to the arrangement of the SRAM cells 200*a* and 200*b* in the even rows.

Figure 10:
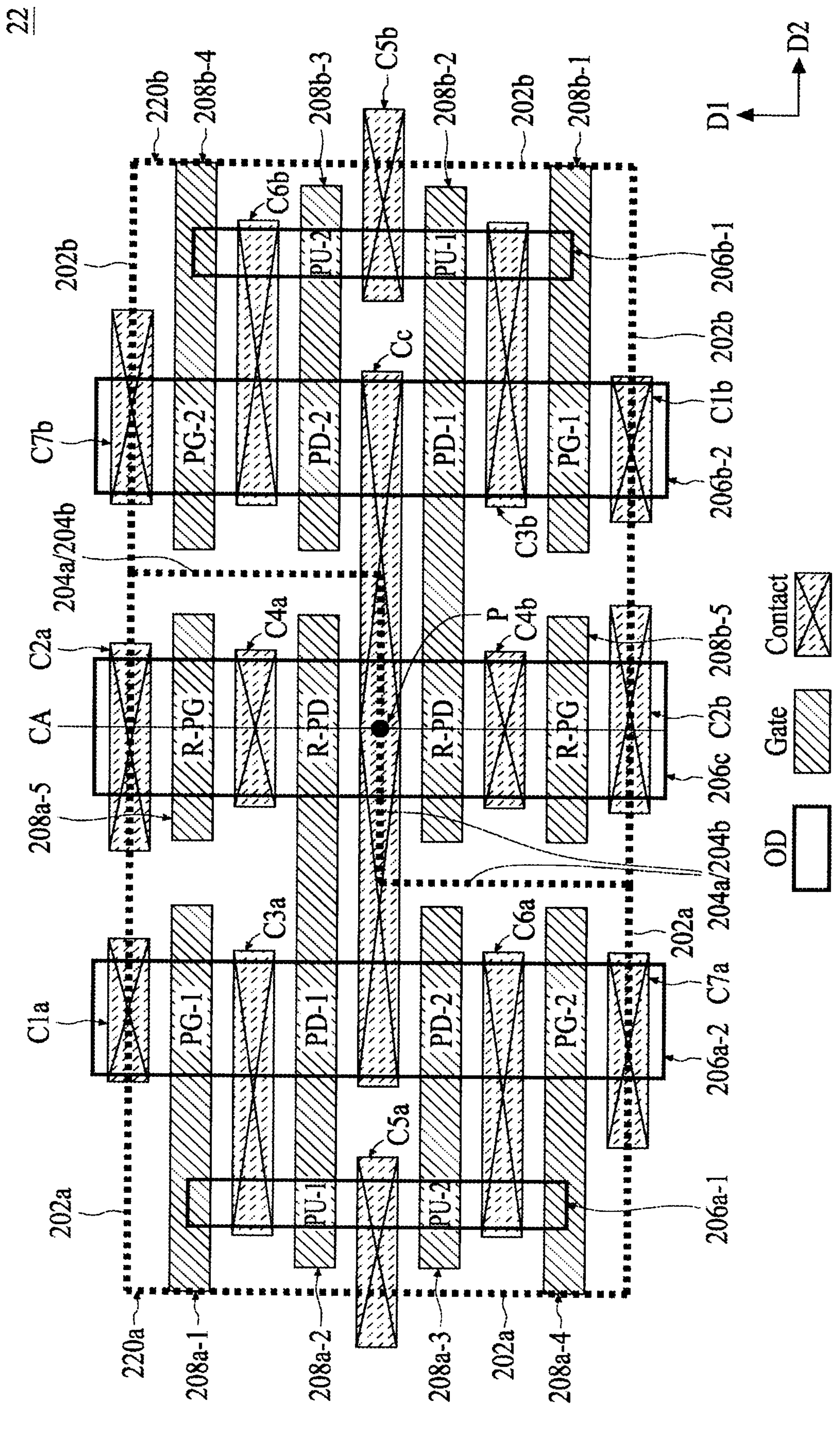
FIGS. 10 to 12 show layout structures of layers involved in a memory device according to aspects of the present disclosure.

FIG. 10 shows layout structures of a portion of a memory device 22 according to aspects of the present disclosure. In some embodiments, the memory device 22 includes two SRAM cells 220*a* and 220*b*. The SRAM cells 220*a* and 220*b* are disposed over a substrate. The SRAM cell 220*a* may be defined by cell boundaries 202*a* and 204*a*, and the SRAM cell 220*b* may be defined by a cell boundaries 202*b* and 204*b*. Further, the cell boundaries 204*a* and 204*b* overlap each other. The cell boundaries 202*a* are coupled to the cell boundaries 202*b* to define a pair of the SRAM cells 220*a* and 220*b*. In some embodiments, the cell boundaries 202*a* and 204*b* define a rectangular shape, but the disclosure is not limited thereto. Various active regions 206*a*-1, 206*a*-2, 206*b*-1, 206*b*-2 and 206*c* are defined in the substrate by isolations and are electrically isolated from each other by the isolations (shown in FIGS. 20 to 25). Details about the active regions and the isolations are similar to those described above; therefore, those details are omitted for brevity.

Still referring to FIG. 10, the SRAM cell 220*a* includes a plurality of gates 208*a*-1 to 208*a*-5 disposed in the cell boundaries 202*a* and 204*a*, and extending in a direction D2. Similarly, the SRAM cell 220*b* includes a plurality of gates 208*b*-1 to 208*b*-5 disposed in the cell boundaries 202*b* and 204*b*, and extending in the direction D2. In some embodiments, the direction D1 and the direction D2 are perpendicular to each other, but the disclosure is not limited thereto. Parameters and materials of the gates are similar to those described above; therefore, those details are omitted for brevity. Different from the gates of the SRAM cells 200*a* and 200*b* of the memory device 20, the gates 208*a*-1 to 208*a*-5 of the SRAM cell 220*a* and the gates 208*b*-1 to 208*b*-5 of the SRAM cell 220*b* are all disposed within the cell boundaries 202*a* and 202*b*.

In some embodiments, the gates 208*a*-1 to 208*a*-5 and the gates 208*b*-1 to 208*b*-5 are arranged to have a point symmetry about a central point P, as shown in FIG. 10.

The gates 208*a*-1 to 208*a*-4 overlap the active regions 206*a*-1 and 206*a*-2, and the gates 208*a*-2 and 208*a*-5 overlap the active region 206*c*. The active regions exposed through two sides of the gates form sources/drains. Accordingly, various transistors are formed by the gates and the sources/drains. The gates 208*b*-1 to 208*b*-4 overlap the active regions 206*b*-1 and 206*b*-2, and the gates 208*b*-2 and 208*b*-5 overlap the active region 206*c*. The active regions exposed through two sides of the gates form sources/drains. Accordingly, various transistors are formed by the gates and the sources/drains. Details about the various transistors are similar to those described above; therefore, those details are omitted for brevity. The memory device 22 therefore includes a dual-port 8T-SRAM cell 220*a* and a dual-port 8T-SRAM cell 220*b*, as shown in FIG. 10.

Still referring to FIG. 10, the memory device 22 includes a plurality of contacts C1*a* to C7*a*, C1*b* to C7*b*, and Cc. The contacts C1*a* to C7*a*, C1*b* to C7*b*, and Cc may have a same width. Further, all the contacts C1*a* to C7*a*, C1*b* to C7*b*, and Cc extend in the direction D2. Arrangements of the contacts C1*a* to C7*a*, C1*b* to C7*b*, and Cc are similar to those described above; therefore, those details are omitted for brevity. Additionally, the C1*a* to C7*a*, C1*b* to C7*b*, and Cc are arranged to have a point symmetry about the central point CP, as shown in FIG. 10.

As mentioned above, the various active regions, the various gates and the various sources/drains are formed by FEOL manufacturing operations, and the various contacts C1*a* to C7*a*, C1*b* to C7*b*, and Cc may be formed by MEOL manufacturing operations.

Figure 11:
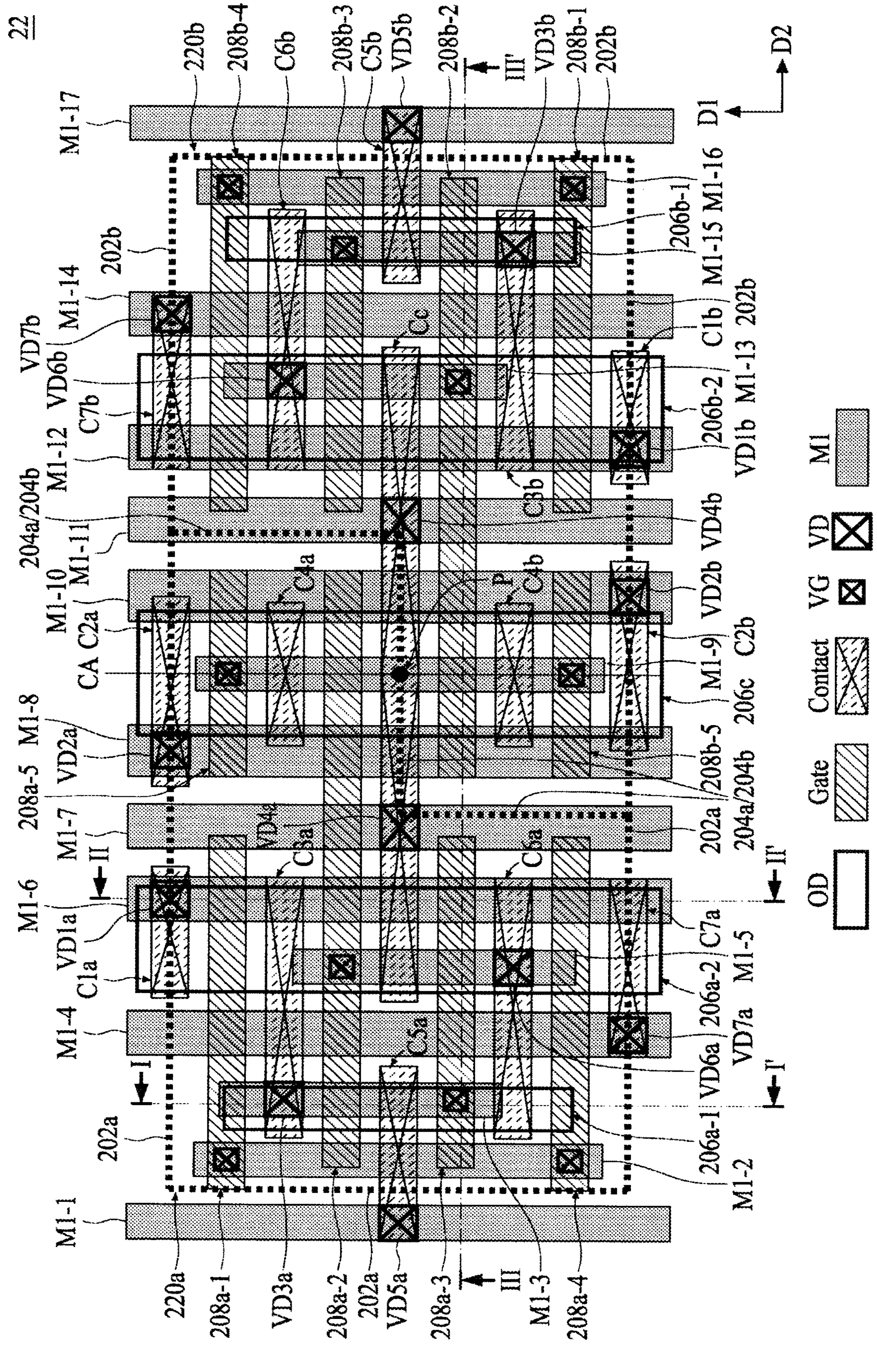

Referring to FIG. 11, in some embodiments, the memory device 22 includes a plurality of vias-to-gate VG. As shown in FIG. 11, each via-to-gate VG overlaps one of the gate s 208*a*-1 to 208*a*-5 and the gates 208*b*-1 to 208*b*-5. The vias-to-gate VG are coupled to and electrically connected to the gates 208*a*-1 to 208*a*-5 and to the gates 208*b*-1 to 208*b*-5, respectively. In some embodiments, the memory device 22 further includes a plurality of vias-to-drain VD (i.e., VD1*a* to VD7*a* and VD1*b* to VD7*b*). The vias-to-drain VD are disposed over the contacts C1*a* to C7*a*, C1*b* to C7*b*, and Cc. In some embodiments, the arrangements of the vias-to-gate VG and the arrangements of the vias-to-drain VD are similar to those described above; therefore, those details are omitted for brevity.

Still referring to FIG. 11, the memory device 22 further includes a plurality of metallization layers M1 (i.e., M1-1 to M1-17) extending in the direction D1. In some embodiments, the metallization layers M1 may be a metallization layer of a BEOL interconnect structure. Further, the metallization layers M1 may be the lowest metallization layer, which is the closest metallization to the substrate, of the BEOL interconnect structure. In some embodiments, widths of the metallization layers M1 are the same, but the disclosure is not limited thereto.

The metallization layers M1 are coupled and electrically connected to the vias. For example, a metallization layer M1-1 is electrically connected to the via-to-drain VD5*a*. The metallization layer M1-2 is electrically connected to the gates 208*a*-1 and 208*a*-4 through the vias-to-gate VG. The metallization layer M1-3 is electrically connected to the via-to-drain VD3*a*, and to the gate 208*a*-3 through the via-to-gate VG. The metallization layer M1-4 is electrically connected to the via-to-drain VD7*a*. The metallization layer M1-5 is electrically connected to the via-to-drain VD6*a*, and to the gate 208*a*-2 through the via-to-gate VG. The metallization layer M1-6 is electrically connected to the via-to-drain VD1*a*. The metallization layer M1-7 is electrically connected to the via-to-drain VD4*a*. The metallization layer M1-8 is electrically connected to the via-to-drain VD2*a*.

The metallization layer M1-9 is electrically connected to the gate structures 208*a*-5 and 208*b*-5 through the vias-to-gate VG.

The metallization layer M1-10 is electrically connected to the via-to-drain VD2*b*. The metallization layer M1-11 is electrically connected to the via-to-drain VD4*b*. The metallization layer M1-12 is electrically connected to the via-to-drain VD1*b*. The metallization layer M1-14 is electrically connected to the via-to-drain VD7*b*. The metallization layer M1-15 is electrically connected to the via-to-drain VD3*b*, and to the gate 208*b*-3 through the via-to-gate VG. The metallization layer M1-16 is electrically connected to the gates 208*b*-4 and 208*b*-1 through the vias-to-gate VG. The metallization layer M1-17 is electrically connected to the via-to-drain VD5*b*. The metallization layer M1-13 is electrically connected to the gate 208*b*-2 through the via-to-gate VG, and to the via-to-drain VD6*b*.

The metallization layer M1-1 serves as a Vdd line. The metallization layer M1-2 serves as a WWL landing line, the metallization layer M1-4 serves as a bit line bar (BLB), the metallization layer M1-6 serves as a bit line (BL), the metallization layer M1-7 serves as a Vss line, the metallization layer M1-8 serves as a read bit line (RBL), and the metallization layer M1-9 serves as a read word line (RWL) landing line for the SRAM cells 220*a* and 220*b*. The metallization layer M1-10 serves as a RBL, the metallization M1-11 serves as Vss line, the metallization layer M1-12 serves as a BL, the metallization layer M1-14 serves as a BLB, and the metallization layer M1-16 serves as a WWL landing line for the SRAM cell 220*b*. The metallization layer M1-17 serves as a Vdd line.

Figure 12:
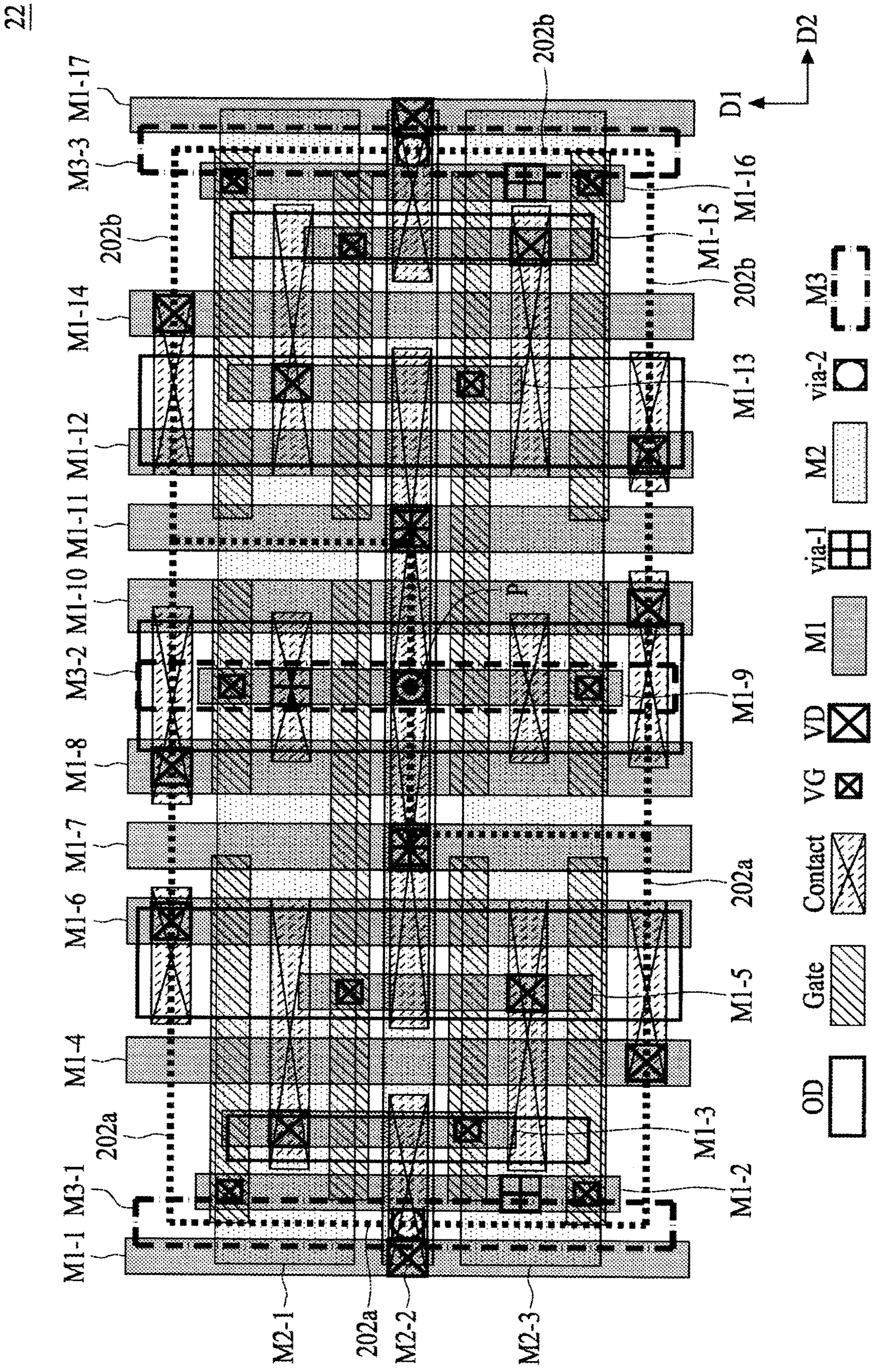

Referring to FIG. 12, in some embodiments, the memory device 22 include further metallization layers M2 and M3 over the metallization layers M1. As mentioned above, the metallization layers M2 are electrically connected to the metallization layers M1 through a plurality of vias-1, and the metallization layers M3 are electrically connected to the metallization layers M2 through a plurality of vias-2. Electrical connections between the metallization layers M1, M2 and M3 are similar to those described above; therefore, those details are omitted for brevity. Accordingly, dual-port 8T-SRAM cells 220*a* and 220*b* are obtained. The dual-port 8T-SRAM cell 220*a* and the dual-port 8T-SRAM cell 220*b* are point symmetrical about the central point P.

Still referring to FIG. 12, it should be noted that in the boundaries 202*a* and 202*b* of the SRAM cells 2200*a* and 220*b*, there are two WWL landing lines (i.e., the metallization layers M1-2 and M1-16). The two Vdd lines (i.e., the metallization layers M1-1 and M1-17) are outside the boundaries 202*a* and 202*b* of the 8T-SRAM cells 220*a* and 220*b*, and respective disposed in boundaries of other SRAM cells.

Figure 13:
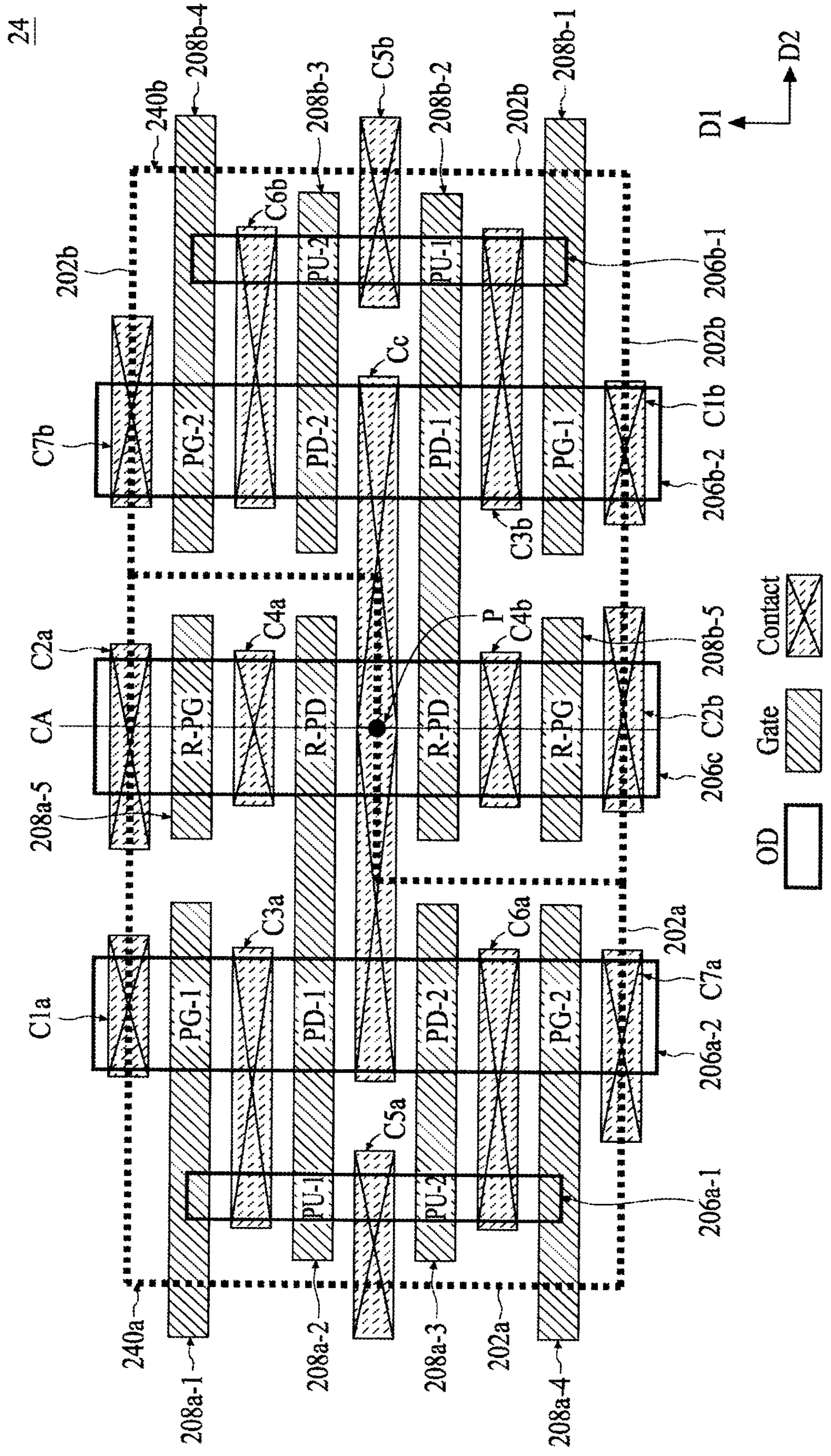
FIGS. 13 to 15 show layout structures of layers involved in a memory device according to aspects of the present disclosure.

FIG. 13 shows layout structures of a portion of a memory device 24 according to aspects of the present disclosure. In some embodiments, the memory device 24 includes two SRAM cells 240*a* and 240*b*. The SRAM cells 240*a* and 240*b* are disposed over a substrate. The SRAM cell 240*a* may be defined by cell boundaries 202*a* and 204*a*, and the SRAM cell 240*b* may be defined by a cell boundaries 202*b* and 204*b*. Further, the cell boundaries 204*a* and 204*b* overlap each other. The cell boundaries 202*a* are coupled to the cell boundaries 202*b* to define a pair of the SRAM cells 240*a* and 240*b*. In some embodiments, the cell boundaries 202*a* and 204*b* define a rectangular shape, but the disclosure is not limited thereto. Various active regions 206*a*-1, 206*a*-2, 206*b*-1, 206*b*-2 and 206*c* are defined in the substrate by isolations and are electrically isolated from each other by the isolations (shown in FIGS. 20 to 25). Details about the active regions and the isolations are similar to those described above; therefore, those details are omitted for brevity.

Still referring to FIG. 13, the SRAM cell 240*a* includes a plurality of gates 208*a*-1 to 208*a*-5 disposed in the cell boundaries 202*a* and 204*a*, and extending in a direction D2. Similarly, the SRAM cell 240*b* includes a plurality of gates 208*b*-1 to 208*b*-5 disposed in the cell boundaries 202*b* and 204*b*, and extending in the direction D2. In some embodiments, the direction D1 and the direction D2 are perpendicular to each other, but the disclosure is not limited thereto. Parameters and materials of the gates are similar to those described above; therefore, those details are omitted for brevity. Different from the gates of the SRAM cells 200*a* and 200*b* of the memory device 20 and the gates of the SRAM cells 220*a* and 220*b* of the memory device 22, the gates 208*a*-1 and 208*a*-4 of the SRAM cell 240*a* and the gates 208*b*-1 and 208*b*-4 of the SRAM cell 240*b* all extend outside the cell boundaries 202*a* and 202*b*.

In some embodiments, the gates 208*a*-1 to 208*a*-5 and the gates 208*b*-1 to 208*b*-5 are arranged to have a point symmetry about a central point P, as shown in FIG. 13.

The gates 208*a*-1 to 208*a*-4 overlap the active regions 206*a*-1 and 206*a*-2, and the gates 208*a*-2 and 208*a*-5 overlap the active region 206*c*. The active regions exposed through two sides of the gates form sources/drains. Accordingly, various transistors are formed by the gates and the sources/drains. The gates 208*b*-1 to 208*b*-4 overlap the active regions 206*b*-1 and 206*b*-2, and the gates 208*b*-2 and 208*b*-5 overlap the active region 206*c*. The active regions exposed through two sides of the gates form sources/drains. Accordingly, various transistors are formed by the gates and the sources/drains. Details about the various transistors are similar to those described above; therefore, those details are omitted for brevity. The memory device 24 therefore includes a dual-port 8T-SRAM cell 240*a* and a dual-port 8T-SRAM cell 240*b*, as shown in FIG. 13.

Still referring to FIG. 13, the memory device 24 includes a plurality of contacts C1*a* to C7*a*, C1*b* to C7*b*, and Cc. The contacts C1*a* to C7*a*, C1*b* to C7*b*, and Cc may have a same width. Further, all the contacts C1*a* to C7*a*, C1*b* to C7*b*, and Cc extend in the direction D2. Arrangements of the contacts C1*a* to C7*a*, C1*b* to C7*b*, and Cc are similar to those described above; therefore, those details are omitted for brevity. Additionally, the contacts C1*a* to C7*a*, C1*b* to C7*b*, and Cc are arranged to have a point symmetry about the central point P, as shown in FIG. 13.

As mentioned above, the various active regions, the various gates and the various sources/drains may be formed by FEOL manufacturing operations, and the various contacts C1*a* to C7*a*, C1*b* to C7*b* and Cc may be formed by MEOL manufacturing operations.

Figure 14:
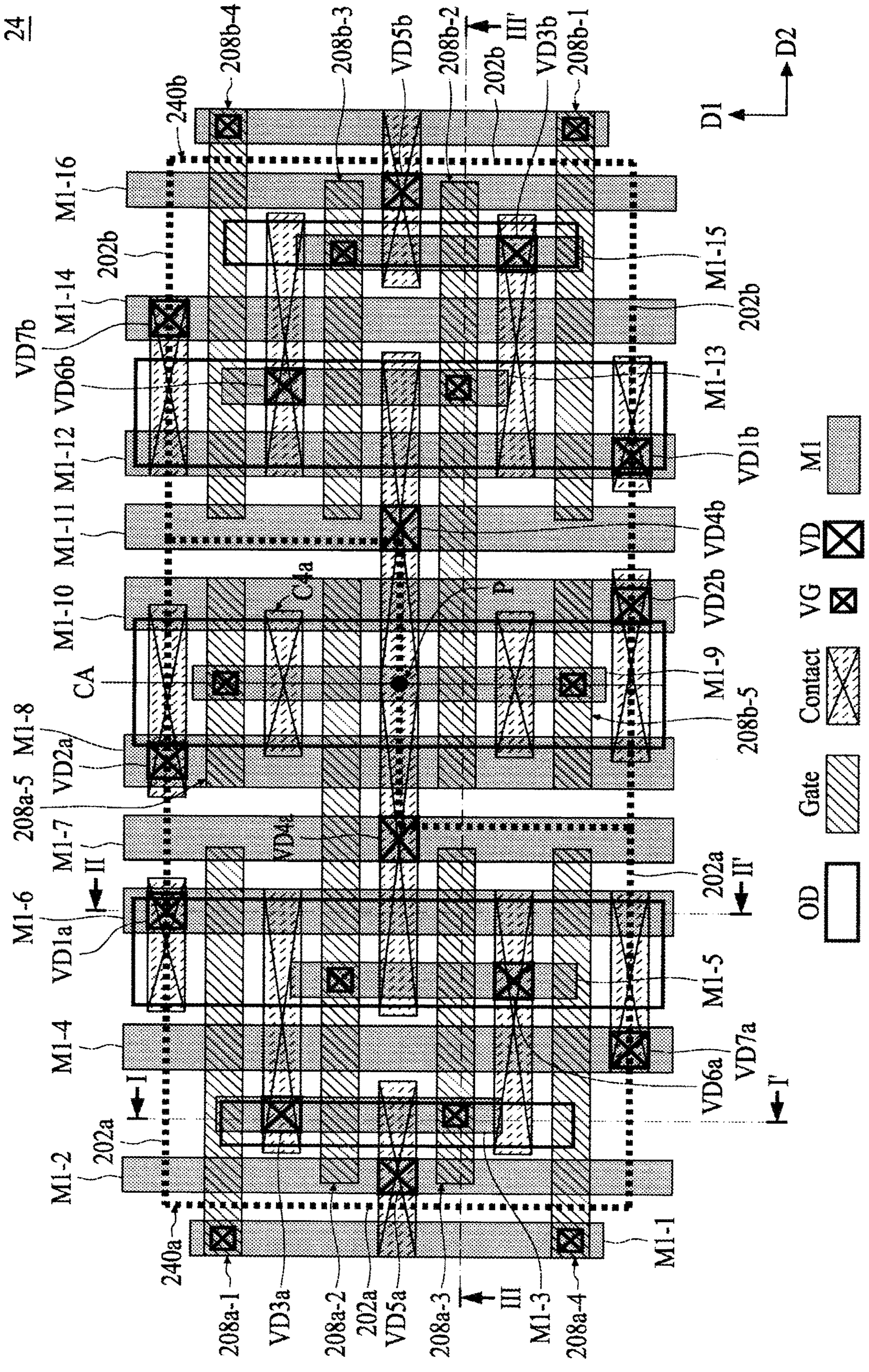

Referring to FIG. 14, in some embodiments, the memory device 24 includes a plurality of vias-to-gate VG. As shown in FIG. 14, each via-to-gate VG overlaps one of the gates 208*a*-1 to 208*a*-5 and the gates 208*b*-1 to 208*b*-5. The vias-to-gate VG are coupled to and electrically connected to the gates 208*a*-1 to 208*a*-5 and to the gates 208*b*-1 to 208*b*-5, respectively. In some embodiments, the memory device 24 further includes a plurality of vias-to-drain VD (i.e., VD1*a* to VD7*a* and VD1*b* to VD7*b*). The vias-to-drain VD are disposed over the contacts C1*a* to C7*a*, C1*b* to C7*b*, and Cc. In some embodiments, the arrangements of the vias-to-gate VG and the arrangements of the vias-to-drain VD are similar to those described above; therefore, those details are omitted for brevity.

Still referring to FIG. 14, the memory device 24 further includes a plurality of metallization layers M1 (i.e., M1-1 to M1-17) extending in the direction D1. In some embodiments, the metallization layers M1 may be a metallization layer of a BEOL interconnect structure. Further, the metallization layers M1 may be the lowest metallization layer, which is the closest metallization to the substrate, of the BEOL interconnect structure. In some embodiments, widths of the metallization layers M1 are the same, but the disclosure is not limited thereto.

The metallization layers M1 are coupled and electrically connected to the vias. For example, the metallization layer M1-1 is electrically connected to the gates 208*a*-1 and 208*a*-4 through the vias-to-gate VG. The metallization layer M1-2 is electrically connected to the via-to-drain VD5*a*. The metallization layer M1-3 is electrically connected to the gate 208*a*-3 through the via-to-gate VG, and to the via-to-drain VD3*a*. The metallization layer M1-4 is electrically connected to the via-to-drain VD7*a*. The metallization layer M1-5 is electrically connected to the via-to-drain VD6*a*. The metallization layer M1-7 is electrically connected to the via-to-drain VD4*a*. The metallization layer M1-8 is electrically connected to the via to source/drain VD2*a*.

The metallization layer M1-9 is electrically connected to the gates 208*a*-5 and 208*a*-5 through the vias-to-gate VG.

The metallization layer M1-10 is electrically connected to the via-to-drain VD2*b*. The metallization layer M1-11 is electrically connected to the via-to-drain VD4*b*. The metallization layer M1-12 is electrically connected to the via-to-drain VD1*b*. The metallization layer M1-13 is electrically connected to the gate 208*b*-2 through the via-to-gate VG, and to the via-to-drain VD6*b*. The metallization layer M1-14 is electrically connected to the via-to-drain VD7*b*. The metallization layer M1-16 is electrically connected to the via-to-drain VD5*b*.

The metallization layer M1-17 is electrically connected to the gates 208*b*-4 and 208*b*-1 through the vias-to-gate VG.

The metallization layer M1-1 serves as a WWL landing line, the metallization layer M1-2 serves as a Vdd line, the metallization layer M1-2 serves as a Vdd line, the metallization layer M1-4 serves as a bit line bar (BLB), the metallization layer M1-6 serves as a bit line (BL), the metallization layer M1-7 serves as a Vss line, and the metallization layer M1-8 serves as a read bit line (RBL) for the SRAM cell 240*a*. The metallization layer M1-9 serves as a read word line (RWL) landing line for the SRAM cells 240*a* and 240*b*. The metallization layer M1-10 serves as a RBL, the metallization layer M1-11 serves as Vss line, the metallization layer M1-12 serves as a BL, the metallization layer M1-14 serves as a BLB, the metallization layer M1-16 serves as a Vdd line, and the metallization layer M1-17 serves a WWL landing line for the SRAM cell 240*b*.

Figure 15:
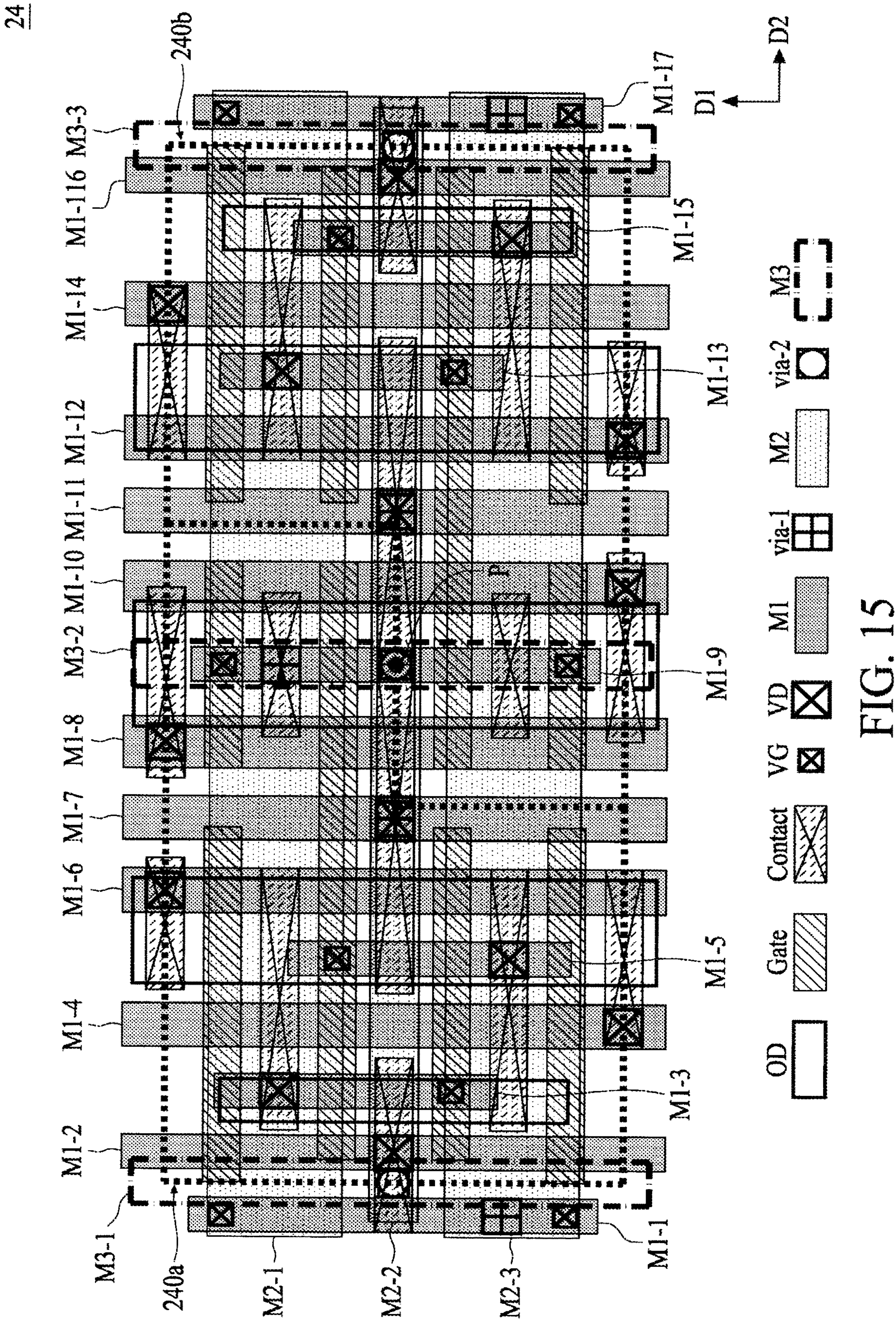

Referring to FIG. 15, in some embodiments, the memory device 24 include further metallization layers M2 and M3 over the metallization layers M1. As mentioned above, the metallization layers M2 are electrically connected to the metallization layers M1 through a plurality of vias-1, and the metallization layers M3 are electrically connected to the metallization layers M2 through a plurality of vias-2. Electrical connections between the metallization layers M1, M2 and M3 are similar to those described above; therefore, those details are omitted for brevity. Accordingly, dual-port 8T-SRAM cells 240*a* and 240*b* are obtained. The dual-port 8T-SRAM cell 240*a* and the dual-port 8T-SRAM cell 240*b* are point symmetrical about the central point CP.

Still referring to FIG. 15, it should be noted that in the boundaries 202*a* and 202*b* of the SRAM cells 240*a* and 240*b*, there are two Vdd lines (i.e., the metallization layers M1-2 and M1-16). The two WWL landing lines (i.e., the metallization layers M1-1 and M1-17) are outside the boundaries 202*a* and 202*b* of the SRAM cells 240*a* and 240*b*, and respectively disposed in boundaries of other SRAM cells.

Figure 16:
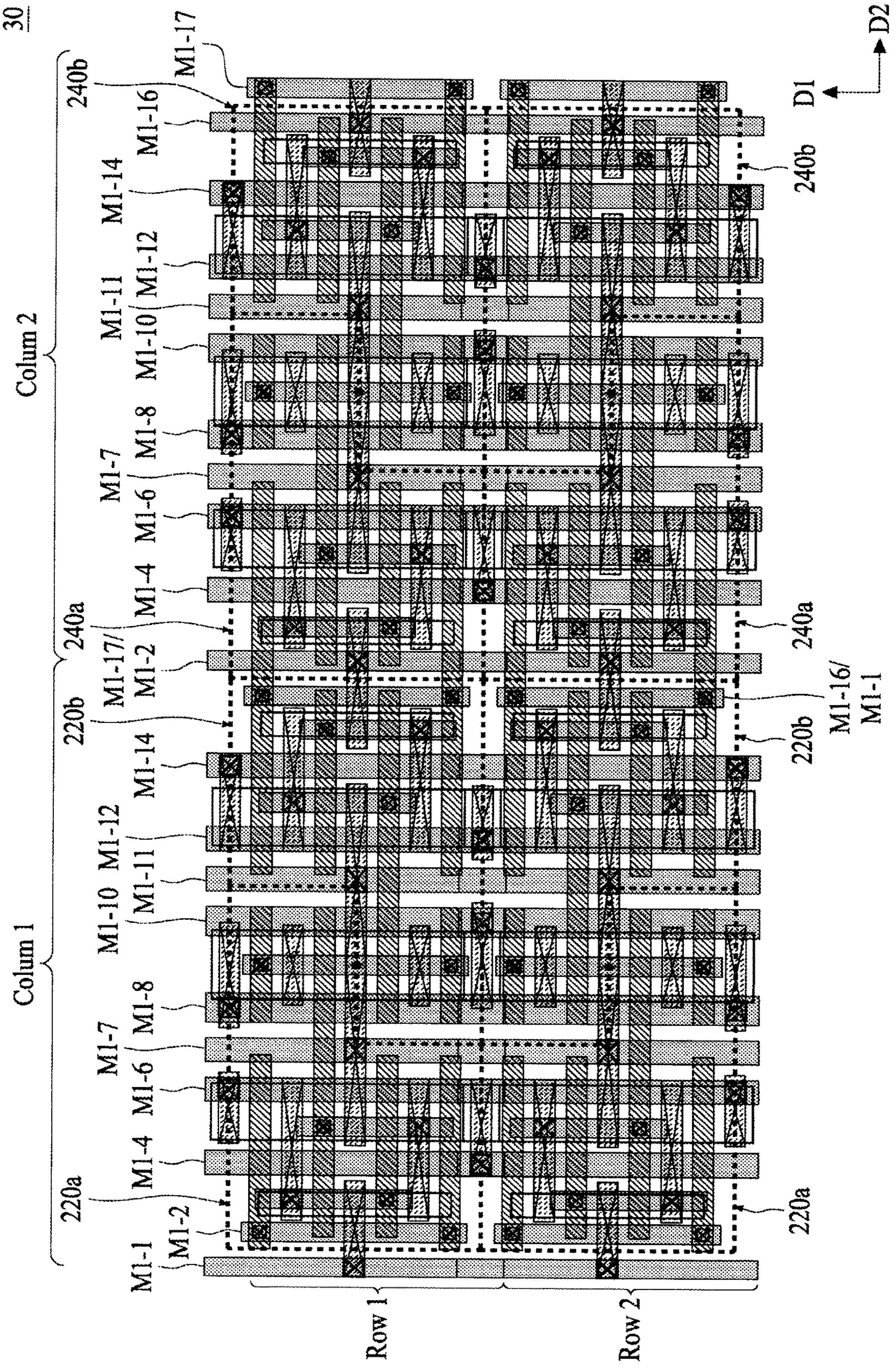
FIG. 16 shows layout structures of layers involved in a memory device according to aspects of the present disclosure.

Referring to FIG. 16, more cells are illustrated. In some embodiments, a memory device 30 can be provided. Further, the memory device 30 can be formed by various memory devices 22 and 24. For example, the memory device 30 can include memory device 22 and memory device 24 left-to-right abutting. According to the memory device 30 provided by some embodiments, the memory cells 220*a* and 220*b* can be arranged in a column (i.e., a Column 1), and the memory cells 240*a* and 240*b* can be arranged in another column (i.e., a Column 2). Further, the Column 1 and the Column 2 are adjacent. In the Column 1, the memory device 22 are periodically arranged to form rows (i.e., a Row 1 and a Row 2). The arrangement of the cells 220*a* and 220*b* in the Row 1 is line symmetrical to the arrangement of the cells 220*a* and 220*b* in the Row 2. In Column 2, the memory device 24 are periodically arranged to form the rows (i.e., the Row 1 and the Row 2). The arrangement of the cells 240*a* and 240*b* in the Row 1 is line symmetrical to the arrangement of the cells 240*a* and 240*b* in the Row 2. Further, the SRAM cell 220*b* of the memory device 22 is adjacent to the SRAM cell 240*a* of the memory device 24 in the each row.

As shown in FIG. 16, the Vdd line (the metallization layer M1-1 in the memory device 22) provides voltages to the SRAM cells 220*a* in the Row 1 and the Row 2 and in the Column 1. The Vdd line (the metallization layer M1-17 in the memory device 22 and the metallization layer M1-2 in the memory device 24) provides voltages to the SRAM cells 220*b* in the Row 1 and the Row 2 and in the Column 1, and to the SRAM cells 240*a* in in the Row 1 and the Row 2 and in the Column 2. The Vdd line (the metallization layer M1-16 of the memory device 24) provides voltage to the SRAM cells 240*b* in in the Row 1 and the Row 2 and in the Column 2. In such embodiments, the metallization layer M1-17 in the Column 1 is referred to the metallization layer M1-2 in the Column 2. In other words, the metallization layer M1-17 in Column n is referred to the metallization layer M1-2 in Column n+1. In such embodiments, n columns require n+1 Vdd lines, instead of 2*n* Vdd lines. N is a positive integer.

Still referring to FIG. 16, the WWL landing line (the metallization layer M1-2 in the memory device 22) provides voltages to the gates of the first and second pass-gate transistors PG-1 and PG-2 of the SRAM cells 220*a* in the Column 1, and the WWL landing line (the metallization layer M1-16 in the memory device 22) provides voltages to the gates of the first and second pass-gate transistors PG-1 and PG-2 of the SRAM cells 220*b* in the Column 1. The WWL landing line (the metallization layer M1-1 of in the memory device 24) provides voltages to the gates of the first and second pass-gate transistors PG-1 and PG-2 of the cells 240*a* in the Column 2. The WWL landing line (the metallization M1-17) provides voltages to the gates of the first and second pass-gate transistors PG-1 and PG-2 of the cells 240*b* in the Column 2. In such embodiments, the metallization layer M1-16 in the Column 1 is referred to the metallization layer M1-1 in the Column 2. In such embodiments, n columns require n+1 WWL landing lines. N is a positive integer.

Figure 17:
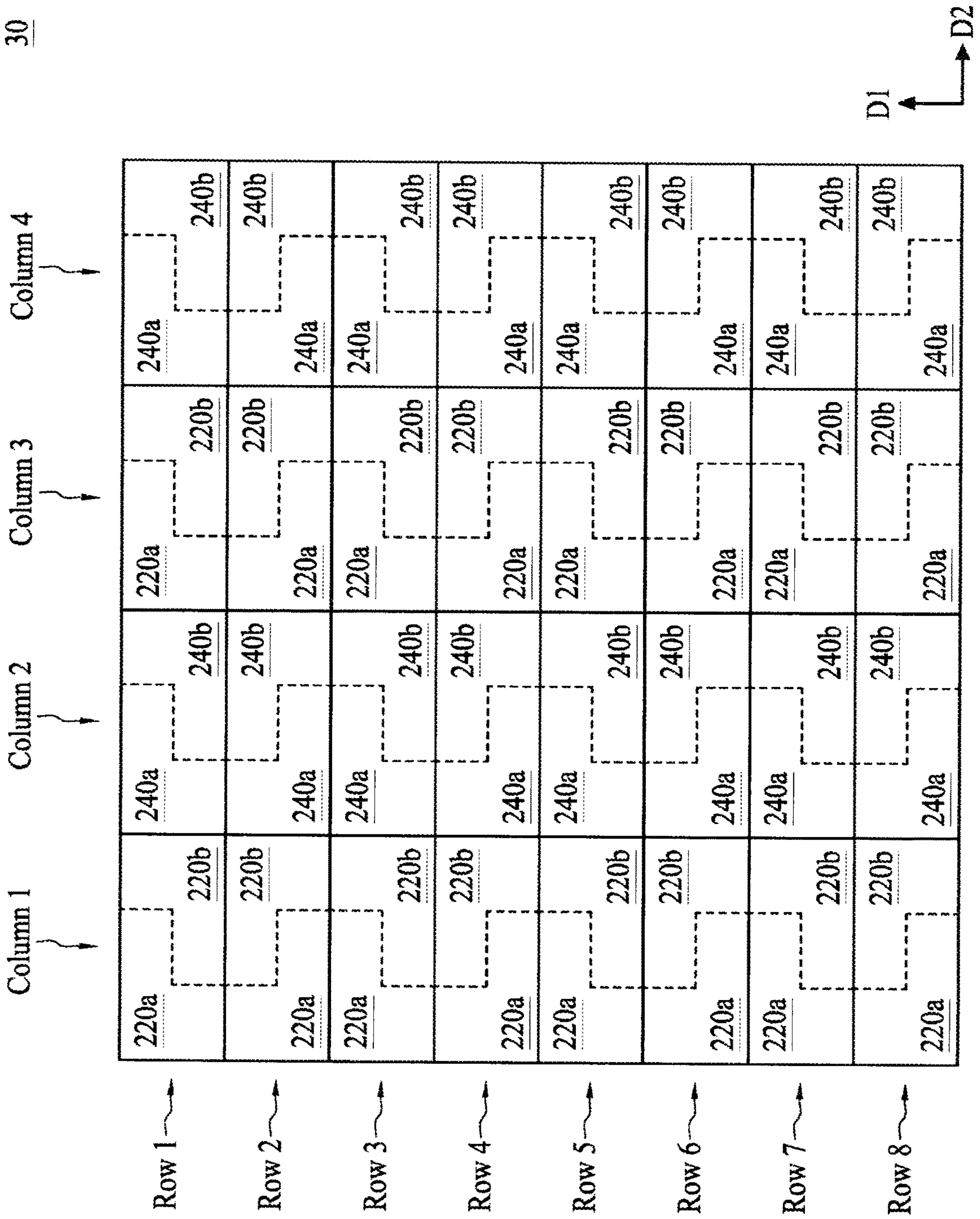
FIG. 17 is a schematic drawing illustrating the memory device of FIG. 16.

Referring to FIG. 17, more cells 220*a*, 220*b*, 240*a* and 240*b* are illustrated. According to the memory device 30 provided by some embodiments, the arrangements of the SRAM cells 220*a* and 220*b* in odd column are the same, and the arrangements of the SRAM cells 240*a* and 240*b* in even column are the same. The SRAM cells 240*a* are adjacent to the SRAM cells 220*b*, and the SRAM cells 240*b* are adjacent to the SRAM cells 220*a*. The arrangements of the SRAM cells 220*a* and 220*b* in odd rows are the same, and the arrangements of the SRAM cells 220*a* and 220*b* in even rows are the same. The arrangements of the SRAM cells 220*a* and 220*b* in the odd rows are line symmetrical to the arrangements of the SRAM cells 220*a* and 220*b* in the even rows. The arrangements of the SRAM cells 240*a* and 240*b* in odd rows are the same, and the arrangements of the SRAM cells 240*a* and 240*b* in even rows are the same. The arrangements of the SRAM cells 240*a* and 240*b* in the odd rows are line symmetrical to the arrangements of the SRAM cells 240*a* and 240*b* in the even rows.

Figure 18:
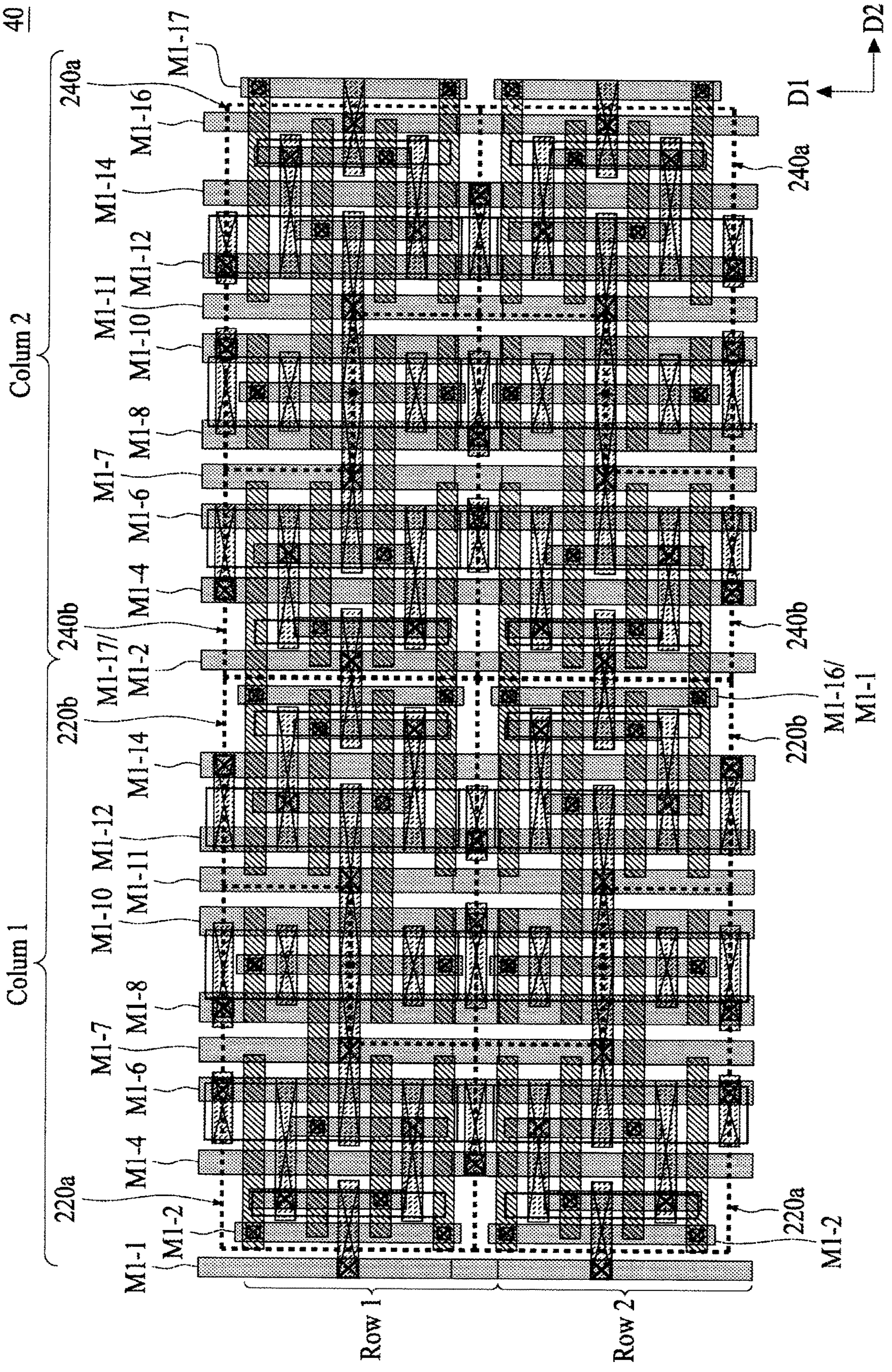
FIG. 18 shows layout structures of layers involved in a memory device according to aspects of the present disclosure.
Figure 19:
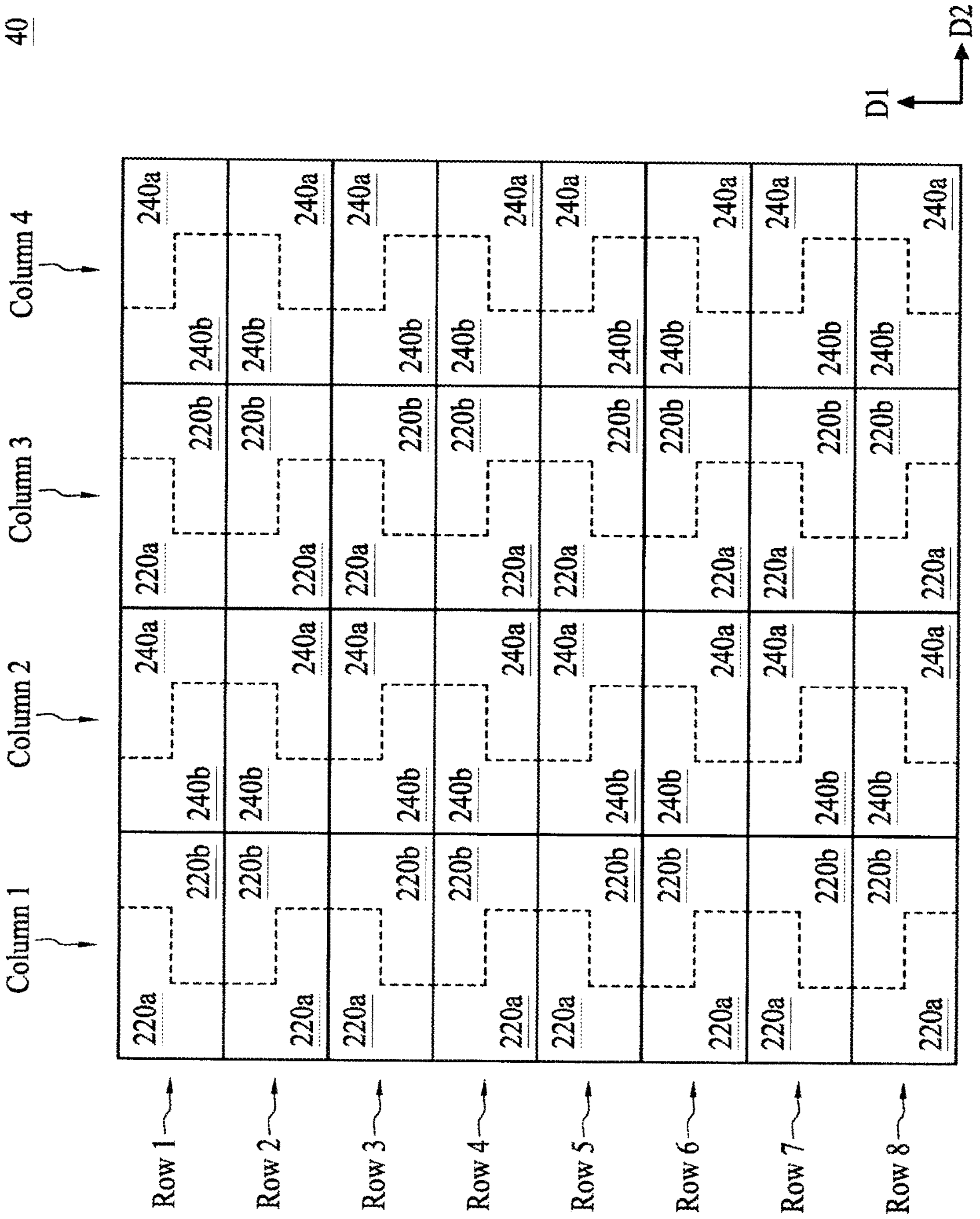
FIG. 19 is a schematic drawing illustrating the memory device of FIG. 18.

Referring to FIGS. 18 and 19, in some embodiments, a memory device 40 including various memory devices 22 and 24 is provided. In contrast with the memory device 30, the SRAM cells 240*a* are adjacent to the SRAM cells 220*a*, and the SRAM cells 240*b* are adjacent to the SRAM cells 220*b*. The SRAM cell 220*a* and the SRAM cell 220*b* in odd rows are line symmetrical to the SRAM cell 220*a* and the SRAM cell 220*b* in even row column. The SRAM cell 240*a* and the SRAM cell 240*b* in the odd rows are line symmetrical to the SRAM cell 240*a* and the SRAM cell 240*b* in the even row.

In such embodiments, electrical connections between the metallization layers M1 and underlying layers of the memory device 40 are identical to those in memory device 30; therefore, those details are omitted for brevity.

Figure 20:
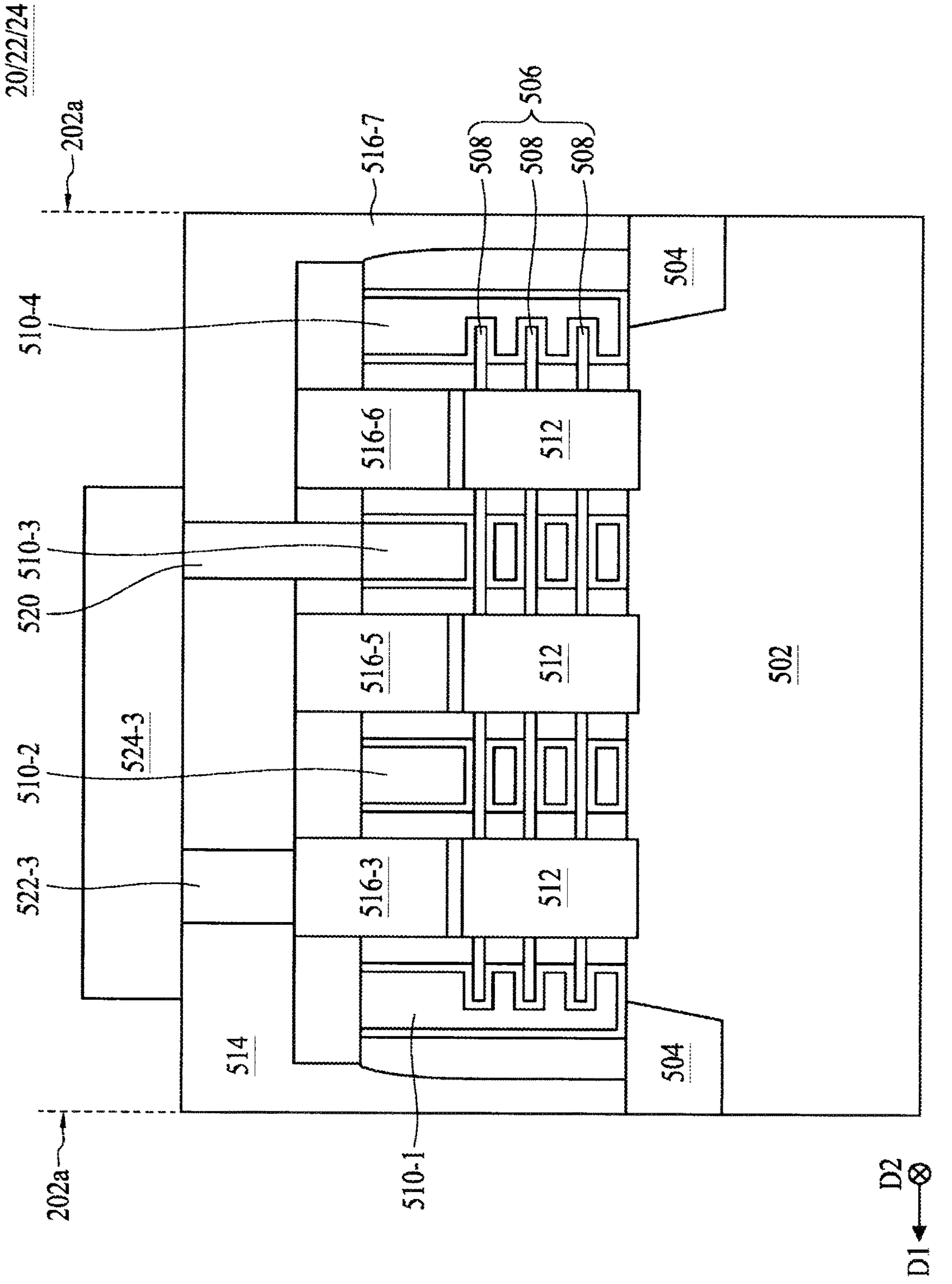
FIG. 20 is a cross-sectional view of a GAA FET device taken along a line I-I' of FIGS. 5, 11 and 14.
Figure 21:
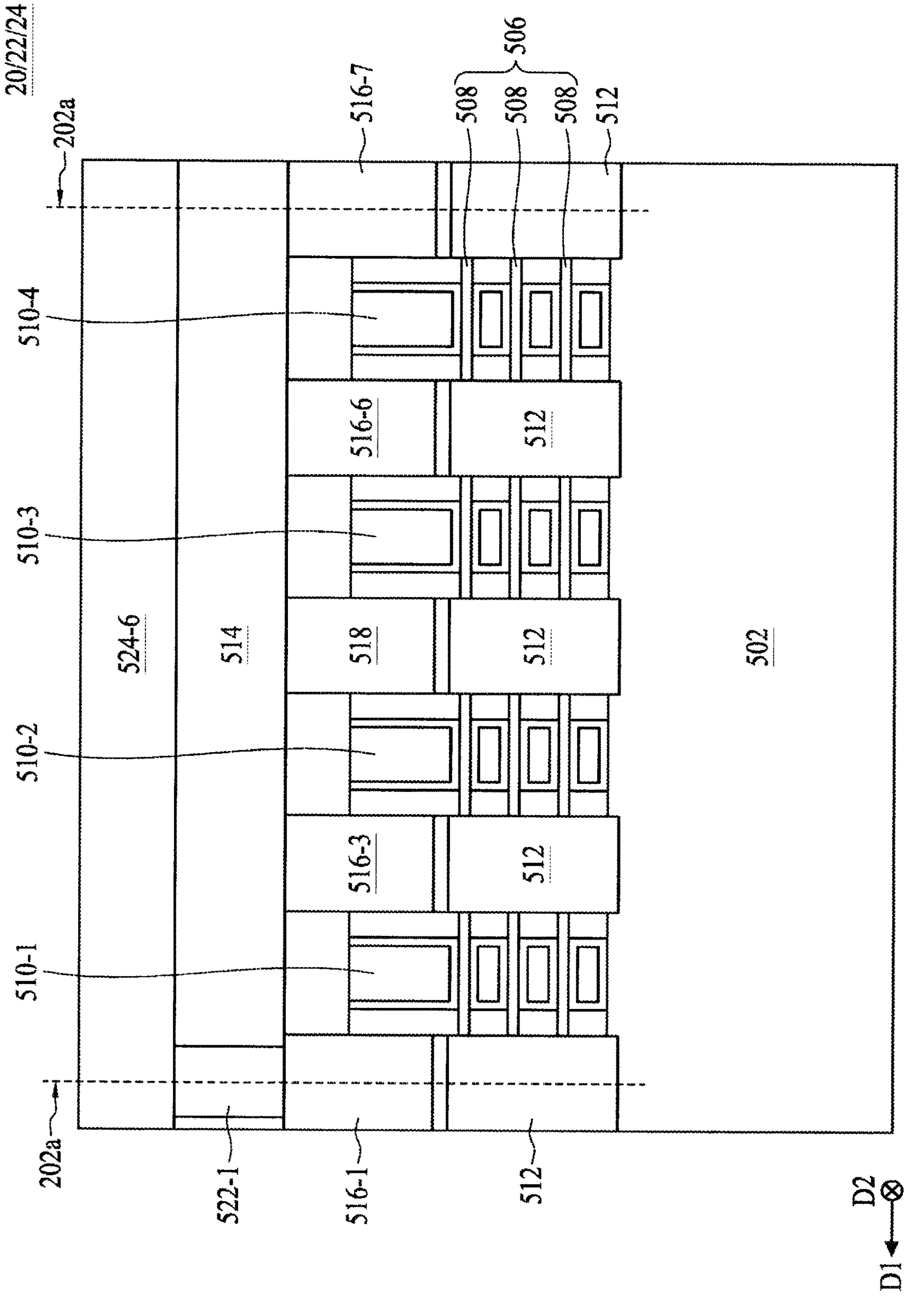
FIG. 21 is a cross-sectional view of a GAA FET device taken along a line II-II' of FIGS. 5, 11 and 14.
Figure 22:
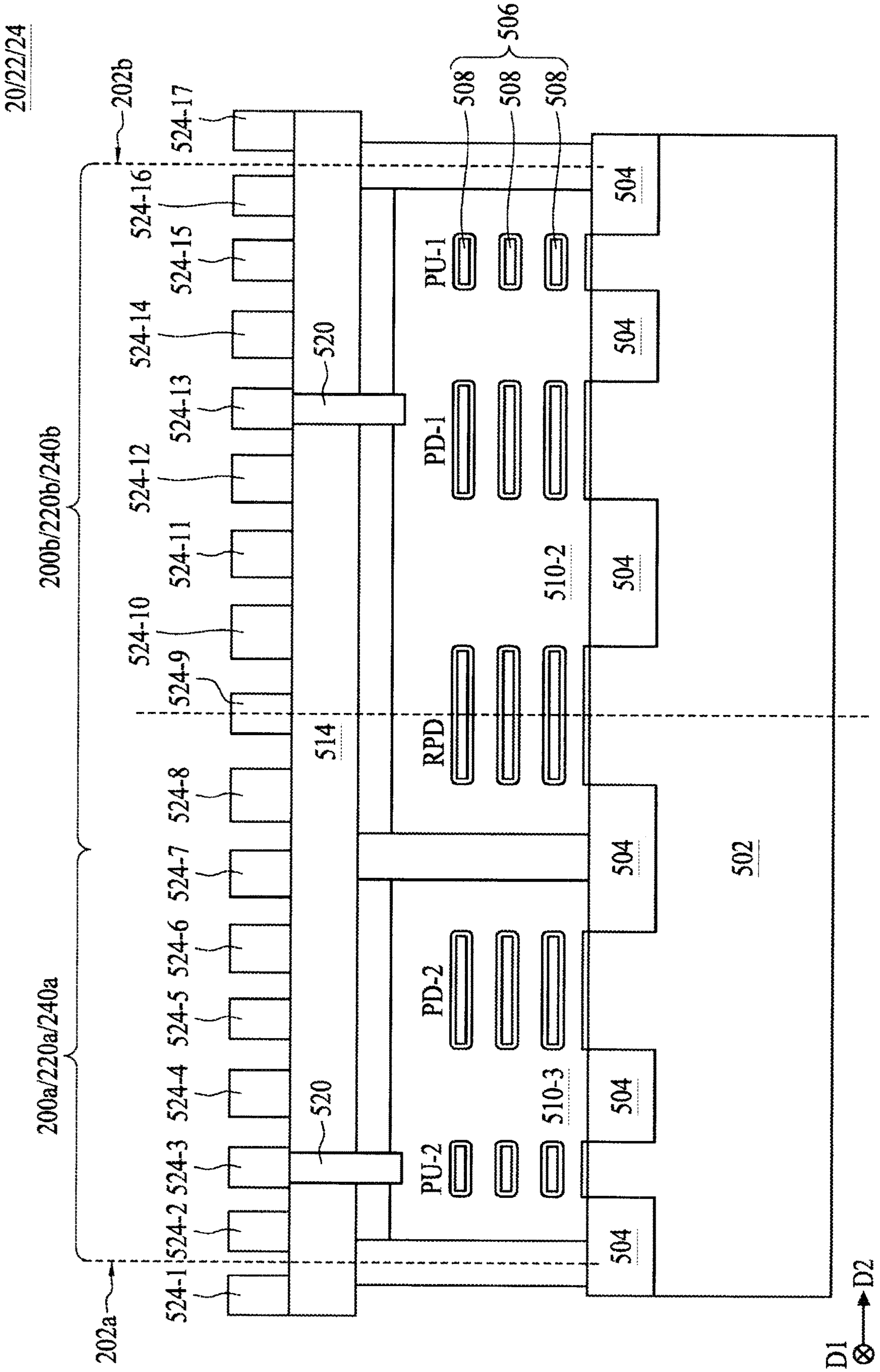
FIG. 22 is a cross-sectional view of a GAA FET device taken along a line III-III' of FIGS. 5, 11 and 14.

Referring to FIGS. 20 to 22, which are cross-sectional views taken along line I-I', II-II' and III-III' of FIG. 5 11 or 14, respectively. In some embodiments, the memory devices 20, 22 and 24 are disposed over a substrate 502. The substrate 502 can be semiconductor substrate. In some embodiments, the semiconductor substrate includes silicon. Alternatively, the semiconductor substrate includes germanium, silicon germanium or other proper semiconductor materials. The semiconductor substrate may include other proper features and structures. In one embodiment, the semiconductor substrate employs a layer of semiconductor material formed over an insulating layer on a supporting bulk wafer for isolation. The technology and structure are referred to as semiconductor on isolation (SOI). The SOI structure can be formed by different techniques including separation by implanted oxygen (SIMOX), bonding and etching back (BESOI), and zone melting and recrystallization (ZMR).

As mentioned above, the active regions are defined in the substrate 502 by isolations 504 and are electrically isolated from each other by the isolations 504. The isolations 504 are formed in the substrate 502 by suitable manufacturing operations. For example, in some embodiments, the isolations 504 are formed by shallow trench isolation (STI) manufacturing operation. In other embodiments, the isolations 504 are formed by local oxidation of silicon (LOCOS) manufacturing operations.

As mentioned above, the active region can be fin active regions. The fin active region may include nano-wire stack or nano-sheet stack 506 for forming GAA FET devices. As shown in FIGS. 20 to 22, each nano-sheet stack 506 includes a plurality of nano-wire or nano-sheet 508. In some embodiments, a number of the nano-sheet 508 may between 2 and 10, but the disclosure is not limited thereto.

As mentioned above, the gates 510-1 to 510-4 are disposed over the substrate 502. For example, the gates 510-1 to 510-4 are disposed over the substrate 502 and the nano-sheet stack 506. Thus, channel regions are formed in each nano-sheet 508 surrounded by the gates 510-1 to 510-4. The gates 510-1 to 510-4 may be referred to as the gates 208*a*-1 to 208*a*-4 in FIGS. 5, 11 and 14, but the disclosure is not limited thereto. Further, as shown in FIG. 22, the gate 510-3 is referred to as the gate 208*a*-3 in each of the SRAM cells 200*a*, 220*a* and 240*a*, and the gate 510-2 in is referred to as the gate 208*b*-2 in each of the SRAM cells 200*b*, 220*b* and 240*b*. It should be noted that elements such as gate electrode, gate dielectric layer and spacers are not pointed in FIGS. 20 to 22, however those skilled in that art would easily realize placements of those elements.

As mentioned above, the sources/drains 512 are formed at two sides of the gates. In some embodiments, an epitaxy semiconductor structure may be selectively formed on the sources/drains 512 and serve as strained features for enhancing mobility and device performance. For example, the P-type FET device may include epitaxially-grown silicon germanium and the N-type FET device may include epitaxially-grown silicon carbide. Accordingly, various transistors are formed by the gates 510-1 to 510-4 and the sources/drains 512. For example, a second pull-up transistor PU-1 a second pull-down transistor PD2 of the SRAM cell 200*a*, 220*a* and 240*a* are obtained as shown in FIG. 22. A read pull-down transistor RPD, a first pull-down transistor PD-1 and a first pull-up transistor PU-1 of the SRAM cell 200*b*, 220*b* and 240*b* are obtained as shown in FIG. 22.

A dielectric structure 514 may be formed to cover the gates 510-1 to 510-4 and the sources/drains 512. The dielectric structure 514 may be a multilayered structure, however those details are omitted for brevity.

As shown in FIGS. 20 to 22, the contacts 516-1, 516-3, 516-5, 516-6, 516-7 and 518 are disposed over the sources/drains 512. In some embodiments, silicide structures may be formed between the contacts 516-1, 516-3, 516-5, 516-6, 516-7, 518 and the sources/drains 512 for reducing resistance. The contacts 516-3, 516-5 and 516-6 in FIG. 20 may be respectively referred to as the contacts C3*a*, C5*a* and C6*a* in FIGS. 5, 11 and 14, but the disclosure is not limited thereto. The contacts 516-1, 516-3, 518, 516-6 and 516-7 in FIG. 21 may be respectively referred to as the contacts C1*a*, C3*a*, Cc, C6*a* and C7*a* in FIGS. 5, 11 and 14, but the disclosure is not limited thereto.

In some embodiments, vias-to-gate 520 are disposed on and electrically connected to the gates (i.e., the gates 510-2 and 510-3). The via-to-gates 520 may be referred to as the via-to-gate VG over the gate structures 208*a*-3 and 208*b*-2 in FIGS. 5, 11 and 14, but the disclosure is not limited thereto.

In some embodiments, a via-to-drain 522-3 is disposed on and electrically connected to the contact 516-3 as shown in FIG. 20, and a via-to-drain 522-1 is disposed on and electrically connected to the contact 516-1 as shown in FIG. 21. The via-to-drain 522-3 in FIG. 20 may be referred to as the via-to-source/drain VD3*a* in FIGS. 5, 11 and 14, and the via-to-drain 522-1 in FIG. 21 may be referred to as the via-to-source/drain VD1*a* in FIGS. 5, 11 and 14, but the disclosure is not limited thereto.

In some embodiments, metallization layers 524-1 to 524-17 are disposed over the dielectric structure 514. The metallization layer 524-3 electrically connects the via-to-drain 522-3 to the via-to-gate 520. The metallization layer 524-6 is disposed over the dielectric structure 514 and electrically connected to the via-to-drain 522-1. In some embodiments, the metallization layers 524-1 to 524-17 may be respectively referred to as the metallization layer M1-1 to M1-17 in FIGS. 5, 11 and 14, but the disclosure is not limited thereto.

Figure 23:
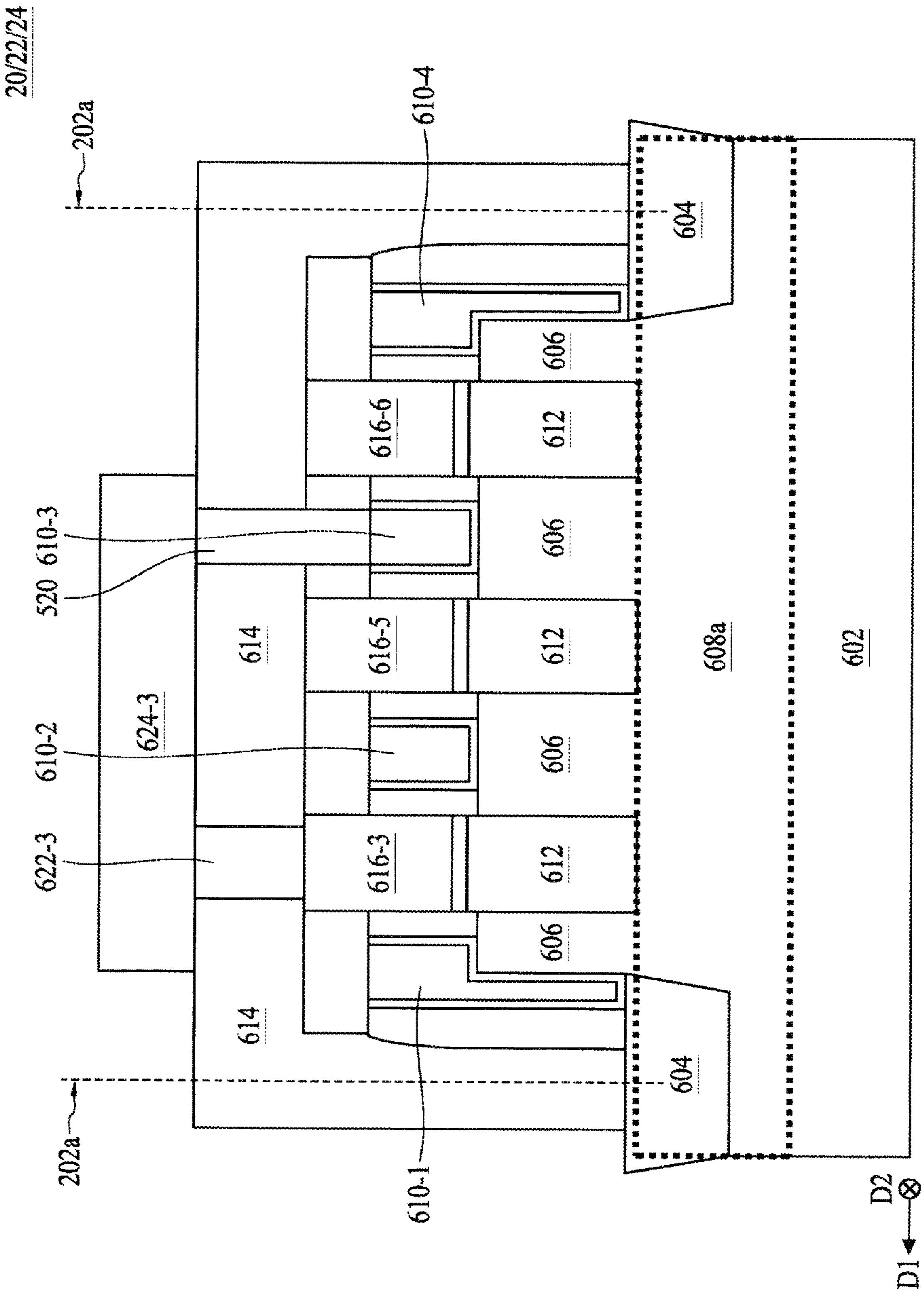
FIG. 23 is a cross-sectional view of a FinFET device taken along a line I-I' of FIGS. 5, 11 and 14.
Figure 24:
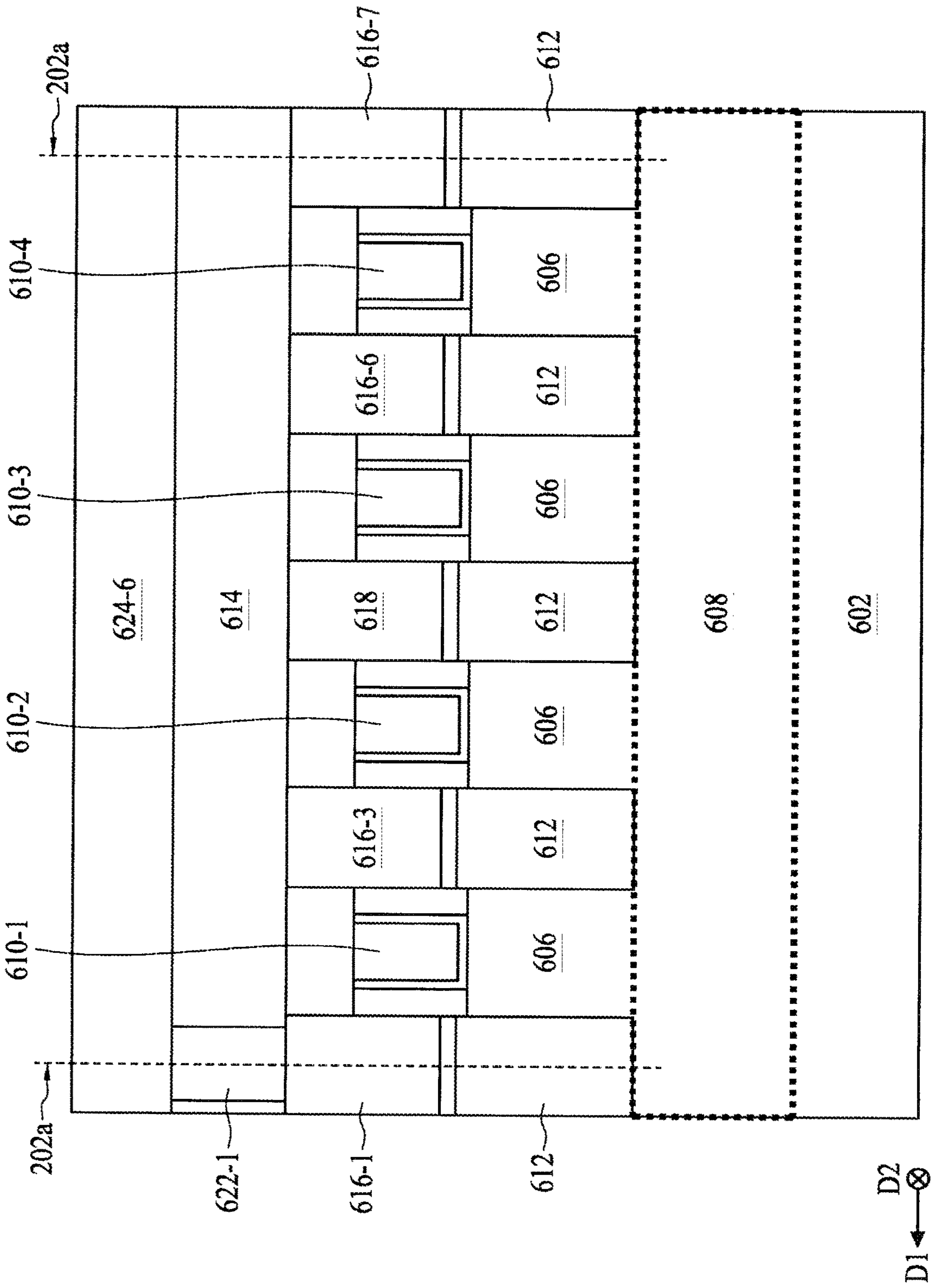
FIG. 24 is a cross-sectional view of a FinFET device taken along a line II-II' of FIGS. 5, 11 and 14.
Figure 25:
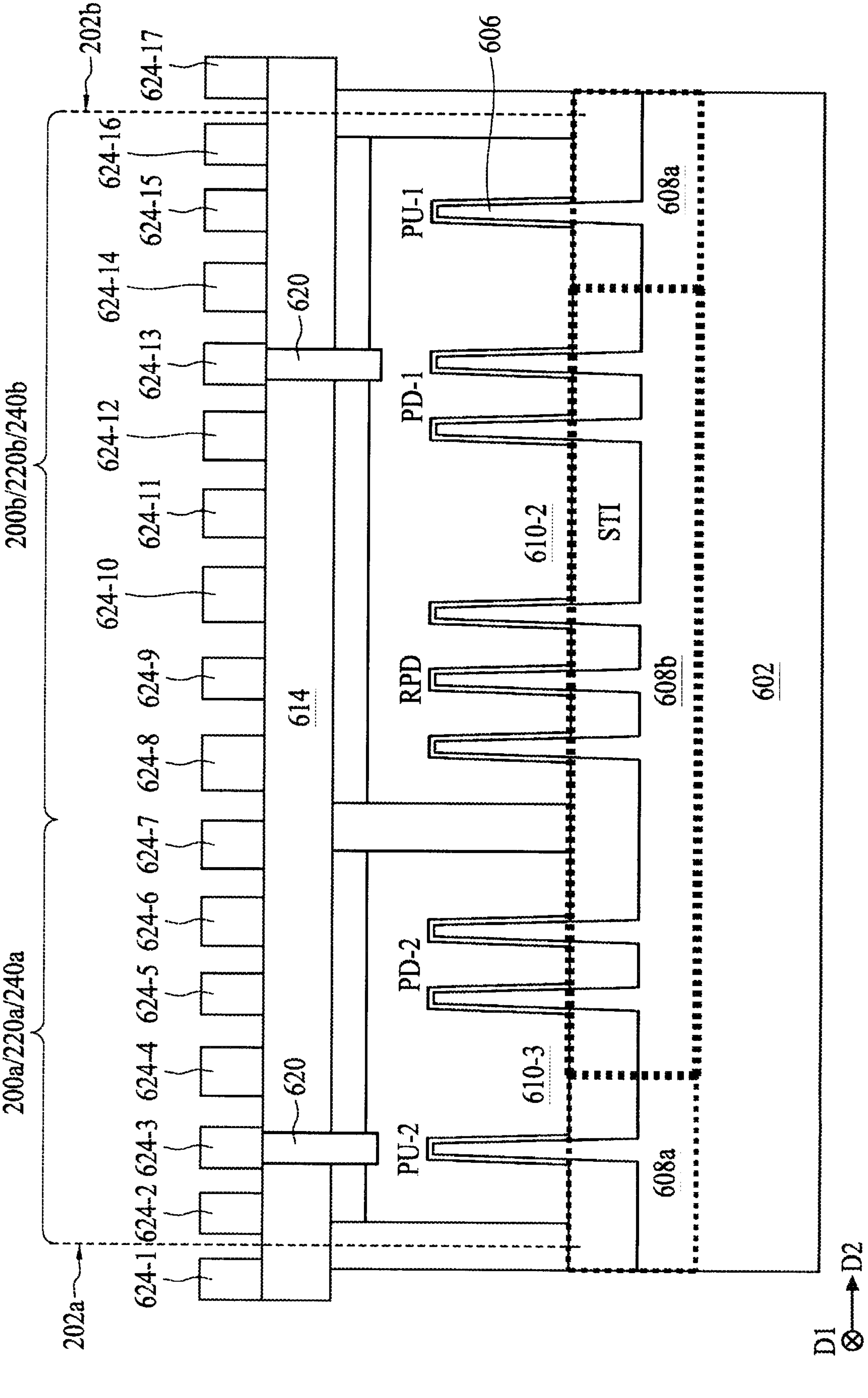
FIG. 25 is a cross-sectional view of a FinFET device taken along a line III-III' of FIGS. 5, 11 and 14.

Referring to FIGS. 23 to 25, which are cross-sectional views taken along line I-I', II-II' and III-III' of FIGS. 5, 11 and 14, respectively. In some embodiments, the memory devices 20, 22 and 24 are disposed over a substrate 502. The substrate 602 can be semiconductor substrate. The substrate 602 may include materials same as the substrate 502; therefore, those details are omitted for brevity.

As mentioned above, the active regions are defined in the substrate 602 by isolations 604 and are electrically isolated from each other by the isolations 604. The isolations 604 are similar to the isolation 504; therefore, the details are omitted for brevity. As mentioned above, the active region can be fin active regions. The fin active region may a plurality of fins 606 for forming FinFET devices. In some embodiments, well regions 608*a* and 608*b* may be disposed between the fins 606 and substrate 602 for electrical isolation. In some embodiments, the well region 608*a* may an n-well, and the well region 608*b* may be a p-well, but the disclosure is not limited thereto.

As mentioned above, the gates 610-1 to 610-4 are disposed over the substrate 602. For example, the gates 610-1 to 610-4 are disposed over the substrate 502 and the fin 606. Thus, channel regions are formed in each fin 606 covered by the gates 610-1 to 610-4. The gate structures 610-1 to 610-4 may be referred to as the gates 208*a*-1 to 208*a*-4 in FIGS. 5, 11 and 14, but the disclosure is not limited thereto. Further, as shown in FIG. 25, the gate 610-3 is referred to as the gate 208*a*-3 in each of the SRAM cells 200*a*, 220*a* and 240*a*, and the gate 610-2 in is referred to as the gate 208*b*-2 in each of the SRAM cells 200*b*, 220*b* and 240*b*. It should be noted that elements such as gate electrode, gate dielectric layer and spacers are not pointed in FIGS. 23 to 25, however those skilled in that art would easily realize placements of those elements.

As mentioned above, the sources/drains 612 are formed at two sides of the gates. In some embodiments, an epitaxy semiconductor structure may be selectively formed on the sources/drains 612 and serve as strained features for enhancing mobility and device performance. For example, the P-type FET device may include epitaxially-grown silicon germanium and the N-type FET device may include epitaxially-grown silicon carbide. Accordingly, various transistors are formed by the gates 610-1 to 610-4 and the sources/drains 612. For example, a second pull-up transistor PU-1 a second pull-down transistor PD2 of the SRAM cell 200*a*, 220*a* and 240*a* are obtained as shown in FIG. 25. A read pull-down transistor RPD, a first pull-down transistor PD-1 and a first pull-up transistor PU-1 of the SRAM cell 200*b*, 220*b* and 240*b* are obtained as shown in FIG. 25.

A dielectric structure 614 may be formed to cover the gates 610-1 to 610-4 and the sources/drains 612. The dielectric structure 614 may be a multilayered structure, however those details are omitted for brevity.

As shown in FIGS. 23 to 25, the contacts 616-1, 616-3, 616-5, 616-6, 616-7 and 618 are disposed over the sources/drains 612. In some embodiments, silicide structures may be formed between the contacts 616-1, 616-3, 616-5, 616-6, 616-7, 618 and the sources/drains 612 for reducing resistance. The contacts 616-3, 616-5 and 616-6 in FIG. 23 may be respectively referred to as the contacts C3*a*, C5*a* and C6*a* in FIGS. 5, 11 and 14, but the disclosure is not limited thereto. The contacts 616-1, 616-3, 618, 616-6 and 616-7 in FIG. 24 may be respectively referred to as the contacts C1*a*, C3*a*, Cc, C6*a* and C7*a* in FIGS. 5, 11 and 14, but the disclosure is not limited thereto.

In some embodiments, vias-to-gate 620 are disposed on and electrically connected to the gates (i.e., the gates 610-2 and 610-3). The vias-to-gate 620 may be referred to as the vias-to-gate VG over the gates 208*a*-3 and 208*b*-2 in FIGS. 5, 11 and 14, but the disclosure is not limited thereto.

In some embodiments, a via-to-drain 622-3 is disposed on and electrically connected to the contact 616-3 as shown in FIG. 23, and a via-to-drain 622-1 is disposed on and electrically connected to the contact 6516-1 as shown in FIG. 24. The via-to-drain 622-3 in FIG. 12 may be referred to as the via-to-drain VD3*a* in FIGS. 5, 11 and 14, and the via-to-drain 622-1 in FIG. 24 may be referred to as the via-to-drain VD1*a* in FIGS. 5, 11 and 14, but the disclosure is not limited thereto.

In some embodiments, metallization layers 624-1 to 624-17 are disposed over the dielectric structure 614. The metallization layer 624-3 electrically connects the via-to-drain 622-3 to the via-to-gate 620. The metallization layer 624-6 is disposed over the dielectric structure 614 and electrically connected to the via-to-drain 622-1. In some embodiments, the metallization layers 624-1 to 624-17 may be respectively referred to as the metallization layer M1-1 to M1-17 in FIGS. 5, 11 and 14, but the disclosure is not limited thereto.

According to one embodiment of the present disclosure, a memory device including two abutting dual-port 8T-SRAM cells is provided. The two SRAM cells can be periodically arranged to form a column-and-row array. Further, n+1 WWL landing lines and n+1 Vdd lines are provided for the 2n SRAM cells. Accordingly, capability for cell scaling down is improved and cell density is increased.

According to one embodiment of the present disclosure, a memory device is provided. The memory device includes a first SRAM cell, a second SRAM cell, a write word line (WWL) landing line, and a Vdd line. The first SRAM cell and the second SRAM cell respectively include 8 transistors. The first WWL landing line is disposed inside a cell boundary of the first SRAM cell. The Vdd line is disposed inside a cell boundary of the second SRAM cell. The first WWL landing line and the Vdd line are in a same layer.

According to one embodiment of the present disclosure, a memory device is provided. The memory device includes a first SRAM cell, a second SRAM cell, a first WWL landing line disposed inside a cell of the first SRAM, a second WWL landing disposed in a cell boundary of the SRAM cell, a first Vdd line disposed outside the boundary of the first SRAM cell and the boundary of the second SRAM cell, and a second Vdd line disposed outside the cell boundary of the first SRAM cell and the boundary of the second SRAM cell. The first SRAM cell and the second SRAM cell are point symmetrical about a central point. The first WWL landing line, the second WWL landing line, the first Vdd line and the second Vee line are in a same layer.

According to one embodiment of the present disclosure, a memory device is provided. The memory device includes a first SRAM cell, a second SRAM, a third SRAM cell, a fourth SRAM cell, a first WWL landing line, a second WWL landing line, a first Vdd line, and a second Vdd line. The first SRAM cell and the second SRAM cell are arranged in a first column, and the third SRAM cell and the fourth SRAM cell are arranged in a second column adjacent to the first column. The first WWL landing line is disposed inside a cell boundary of the first SRAM cell. The second WWL landing line is disposed inside a cell boundary of the second SRAM. The first Vdd line is disposed outside the boundary of the first SRAM cell and the boundary of the second SRAM cell. The second Vdd line is disposed outside the cell boundary of the first SRAM cell and the boundary of the second SRAM cell. The first SRAM cell, the second SRAM cell, the third SRAM cell and the fourth SRAM cell are arranged to form a row. The second SRAM cell is adjacent to the fourth SRAM cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:

a first static random access memory (SRAM) cell comprising 8 transistors;

a second SRAM cell comprising 8 transistors;

a first write word line (WWL) landing line disposed inside a cell boundary of the first SRAM cell;

a Vdd line disposed inside a cell boundary of the second SRAM cell; and a read word line (RWL) landing line electrically connected to the first SRAM cell and the second SRAM cell, wherein the RWL landing line comprises a first portion disposed inside the cell boundary of the first SRAM cell and a second portion disposed inside the cell boundary of the second SRAM cell, wherein the RWL landing line, the first WWL landing line, and the Vdd line are in a first layer.

2. The memory device of claim 1, further comprising:

a write word line (WWL) electrically connected to the first WWL landing line; and a read word line (RWL) electrically connected to the RWL landing line, wherein the WWL and the RWL are in a second layer overlying the RWL landing line, the first WWL landing line, and the Vdd line.

3. The memory device of claim 2, wherein the RWL landing line, the first WWL landing line, and the Vdd line have a longest dimension extending in a first direction, and the WWL and the RWL have a longest dimension extending in a second direction different from the first direction.

4. The memory device of claim 1, further comprising:
a third SRAM cell comprising 8 transistors;
a fourth SRAM cell comprising 8 transistors; and
a second WWL landing line disposed inside a cell boundary of the third SRAM cell,
wherein the third SRAM cell is identical to the first SRAM cell, and the fourth SRAM cell is identical to the second SRAM cell.

5. The memory device of claim 4, wherein the first SRAM cell, the second SRAM cell, the third SRAM cell, and the fourth SRAM cell are arranged to form a row, the third SRAM cell is adjacent to the second SRAM cell, and the second SRAM cell and the third SRAM cell are electrically connected to the second WWL landing line in the third SRAM cell.

6. The memory device of claim 5, wherein the second SRAM cell and the third SRAM cell are electrically connected to the Vdd line in the second SRAM cell.

7. The memory device of claim 5, wherein the first SRAM cell, the second SRAM cell, the third SRAM cell, and the fourth SRAM cell are arranged to form a column, and the first SRAM cell and the second SRAM cell are line symmetrical to the third SRAM cell and the fourth SRAM cell.

8. A memory device comprising:
a first static random access memory (SRAM) cell comprising a first active region having a longest dimension extending in a first direction and a gate having a longest dimension extending in a second direction different than the first direction;
a second SRAM cell;
a first write word line (WWL) landing line having a longest dimension extending in the first direction and disposed inside a cell boundary of the first SRAM cell;
a second WWL landing line having a longest dimension extending in the first direction and disposed inside a cell boundary of the second SRAM cell;
a first Vdd line having a longest dimension extending in the first direction and disposed outside the cell boundary of the first SRAM cell and the cell boundary of the second SRAM cell;
a second Vdd line having a longest dimension extending in the first direction and disposed outside the cell boundary of the first SRAM cell and the cell boundary of the second SRAM cell, wherein the first WWL landing line and the second WWL landing line are disposed between the first VDD line and the second VDD line along the second direction; and
a read word line (RWL) landing line electrically connected to the first SRAM cell and the second SRAM cell, wherein the RWL landing line comprises a first portion disposed inside the cell boundary of the first SRAM cell and a second portion disposed inside the cell boundary of the second SRAM cell,
wherein the first SRAM cell and the second SRAM cell are point symmetrical about a central point, and the first WWL landing line, the second WWL landing line, the first Vdd line, and the second Vdd line are in a first layer.

9. The memory device of claim 8, wherein the RWL landing line, the first WWL landing line, the second WWL landing line, the first Vdd line, and the second Vdd line are in the first layer.

10. The memory device of claim 8, further comprising:
a write word line (WWL) electrically connected to the first WWL landing line and the second WWL landing line; and
a read word line (RWL) electrically connected to the RWL landing line,
wherein the WWL and the RWL are in a second layer overlying the RWL landing line, the first WWL landing line, the second WWL landing line, the first Vdd line, and the second Vdd line.

11. The memory device of claim 10, wherein the RWL landing line has a longest dimension extending in the first direction, and the RWL and the WWL have a longest dimension extending in the second direction.

12. The memory device of claim 8, further comprising a third SRAM cell and a fourth SRAM cell, wherein the second Vdd line is disposed inside a cell boundary of the third SRAM cell.

13. The memory device of claim 12, wherein the first SRAM cell, the second SRAM cell, the third SRAM cell, and the fourth SRAM cell are arranged to form a row, wherein the third SRAM cell is adjacent to the second SRAM cell, and the second SRAM cell and the third SRAM cell are electrically connected to the second WWL landing line in the second SRAM cell.

14. The memory device of claim 13, wherein the second SRAM cell and the third SRAM cell are electrically connected to the second Vdd line inside the cell boundary of the third SRAM cell.

15. The memory device of claim 12, wherein the first SRAM cell and the second SRAM cell are periodically arranged to form a first column, the third SRAM cell and the fourth SRAM cell are periodically arranged to form a second column, and the second SRAM cell is adjacent to the third SRAM cell.

16. A memory device comprising:
a first static random access memory (SRAM) cell and a second SRAM cell arranged in a first column, wherein the first SRAM cell comprises a first gate having a longest dimension extending in a first direction and the second SRAM cell comprises a second gate having a longest dimension extending in the first direction;
a third SRAM cell and a fourth SRAM cell arranged in a second column adjacent to the first column;
a first write word line (WWL) landing line disposed inside a cell boundary of the first SRAM cell;
a second WWL landing line disposed inside a cell boundary of the second SRAM cell;
a first Vdd line disposed outside the cell boundary of the first SRAM cell and the cell boundary of the second SRAM cell;
a second Vdd line disposed outside the cell boundary of the first SRAM cell and the cell boundary of the second SRAM cell; and
a read word line (RWL) landing line electrically connected to the first SRAM cell and the second SRAM cell and having a longest dimension extending in a second direction different than the first direction, wherein the RWL landing line comprises a first portion disposed inside the cell boundary of the first SRAM cell and overlying the first gate and a second portion disposed inside the cell boundary of the second SRAM cell and overlying the second gate, wherein the first SRAM cell, the second SRAM cell, the third SRAM cell, and the fourth SRAM cell are arranged to form a row, the second SRAM cell is adjacent to the fourth SRAM cell, and the second Vdd line is disposed in a cell boundary of the fourth SRAM cell.

17. The memory device of claim 16, wherein, and the second SRAM cell and the fourth SRAM cell are electrically connected to the second WWL landing line in the second SRAM cell, and the second SRAM cell and the fourth SRAM cell are electrically connected to the second Vdd line inside of the fourth SRAM cell.

18. The memory device of claim 16, wherein the first SRAM cell and the second SRAM cell are periodically arranged to form the first column, and the third SRAM cell and the fourth SRAM cell are periodically arranged to form the second column.

19. The memory device of claim 18, wherein the first SRAM cell and the second SRAM cell in a first row in the first column are line symmetrical to the first SRAM cell and the second SRAM cell in a second row in the first column, and the third SRAM cell and the fourth SRAM cell in a first row in the second column are line symmetrical to the third SRAM cell and the fourth SRAM cell in a second row in the second column.

20. The memory device of claim 16, comprising a first via extending from the RWL landing line to the first gate and a second via extending from the RWL landing line to the second gate, wherein the first SRAM cell and the second SRAM cell are point symmetrical about a central point, and the first via and the second via are equidistant from the central point.

* * * * *